(12) United States Patent
Ito

(10) Patent No.: US 11,737,261 B2
(45) Date of Patent: Aug. 22, 2023

(54) SEMICONDUCTOR STORAGE DEVICE HAVING A CONTACT ISOLATED FROM A CONDUCTOR LAYER BY OXIDIZED PORTIONS AND METHOD FOR MANUFACTURING THE SAME

(71) Applicant: KIOXIA CORPORATION, Tokyo (JP)

(72) Inventor: Takamasa Ito, Nagoya Aichi (JP)

(73) Assignee: Kioxia Corporation, Tokyo (JP)

( * ) Notice: Subject to any disclaimer, the term of this patent is extended or adjusted under 35 U.S.C. 154(b) by 488 days.

(21) Appl. No.: 16/805,466

(22) Filed: Feb. 28, 2020

(65) Prior Publication Data
US 2021/0066329 A1 Mar. 4, 2021

(30) Foreign Application Priority Data

Sep. 3, 2019 (JP) ................. 2019-160282

(51) Int. Cl.
*H10B 41/27* (2023.01)
*G11C 5/06* (2006.01)
(Continued)

(52) U.S. Cl.
CPC ............. *H10B 41/27* (2023.02); *G11C 5/025* (2013.01); *G11C 5/06* (2013.01); *H01L 21/0223* (2013.01); *H01L 21/02236* (2013.01); *H10B 43/10* (2023.02); *H10B 43/27* (2023.02); *H10B 43/50* (2023.02); *H10B 43/40* (2023.02)

(58) Field of Classification Search
CPC ......... H01L 27/11556; H01L 27/11582; H01L 27/11519; H01L 27/11521; H01L 27/11524; H01L 27/11526; H01L 27/11529; H01L 27/11548; H01L 27/11565; H01L 27/11568; H01L 27/1157; H01L 27/11573; H01L 27/11575
See application file for complete search history.

(56) References Cited

U.S. PATENT DOCUMENTS 10,043,821 B2 8/2018 Tsuji et al.
10,249,640 B2 4/2019 Yu et al.
(Continued)

FOREIGN PATENT DOCUMENTS

| CN | 108766971 A | 11/2018 |
| CN | 109075190 A | 12/2018 |
| TW | 201834219 A | 9/2018 |

*Primary Examiner* — Younes Boulghassoul
(74) *Attorney, Agent, or Firm* — Kim & Stewart LLP

(57) ABSTRACT

A semiconductor storage device includes a substrate, a first conductor layer, a plurality of second conductor layers, and a first contact. The substrate includes a core region, a first region surrounding the core region, and a second region connecting the core region and the first region. The first conductor layer is above the core region, the first region, and the second region. The second conductor layers are above the first conductor layer above the core region. The first contact is above the first region and extends in the thickness direction. The first contact separates the first conductor layer above the first region into a first portion surrounded by the first contact and a second portion surrounding the first contact. The first portion of the first conductor layer includes a first oxidized portion, and the second portion of the first conductor layer includes a second oxidized portion.

20 Claims, 18 Drawing Sheets

(51) Int. Cl.
*G11C 5/02* (2006.01)
*H01L 21/02* (2006.01)
*H10B 43/27* (2023.01)
*H10B 43/10* (2023.01)
*H10B 43/50* (2023.01)
*H10B 43/40* (2023.01)

(56) References Cited

U.S. PATENT DOCUMENTS 10,692,869 B2    6/2020  Takemura et al.
2018/0247951 A1* 8/2018  Fujii ................. H01L 27/11573

* cited by examiner

SEMICONDUCTOR STORAGE DEVICE HAVING A CONTACT ISOLATED FROM A CONDUCTOR LAYER BY OXIDIZED PORTIONS AND METHOD FOR MANUFACTURING THE SAME

CROSS-REFERENCE TO RELATED APPLICATION(S)

This application is based upon and claims the benefit of priority from Japanese Patent Application No. 2019-160282, filed on Sep. 3, 2019, the entire contents of which are incorporated herein by reference.

FIELD

Embodiments described herein relate generally to a semiconductor storage device and a method for manufacturing the semiconductor storage device.

BACKGROUND

A NAND flash memory capable of storing data in a nonvolatile manner is known.

DETAILED DESCRIPTION

Embodiments can reduce power consumption of a semiconductor storage device.

In general, according to an embodiment, a semiconductor storage device includes a substrate, a first conductor layer, a plurality of second conductor layers, a plurality of pillars, and a first contact. The substrate includes a core region, a first region surrounding the core region, and a second region connecting the core region and the first region. The first conductor layer is provided above the core region, the first region, and the second region of the substrate. The plurality of second conductor layers are spaced from each other in a thickness direction of the substrate above the first conductor layer above the core region. The plurality of memory pillars extend through the plurality of second conductor layers and contacting the first conductor layer in the core region. The first contact is provided above the first region of the substrate and extends in the thickness direction of the substrate. The first contact surrounds the plurality of second conductor layers above the core region and separates a part of the first conductor layer above the first region into a first portion surrounded by the first contact and a second portion surrounding the first contact. The first portion of the first conductor layer includes a first oxidized portion that contacts the first contact. The second portion of the first conductor layer includes a second oxidized portion that contacts the first contact.

In the following description, components having substantially the same functions and configurations are denoted by the same reference symbols. Certain elements or aspects which are repeated, or have multiple instances, may be labeled with a combination of a base reference symbol and an indexing value (e.g., word lines WL0 . . . WL7). When it is not necessary to distinguish between such labelled elements then each may be referenced by only the base reference symbol (e.g., a word line WL) or similarly referenced as a collective (e.g., word lines WL).

[1] Embodiment

Hereinafter, a semiconductor storage device 1 according to an embodiment will be described.

[1-1] Configuration of Semiconductor Storage Device 1

[1-1-1] Overall Configuration of Semiconductor Storage Device 1

Figure 1:
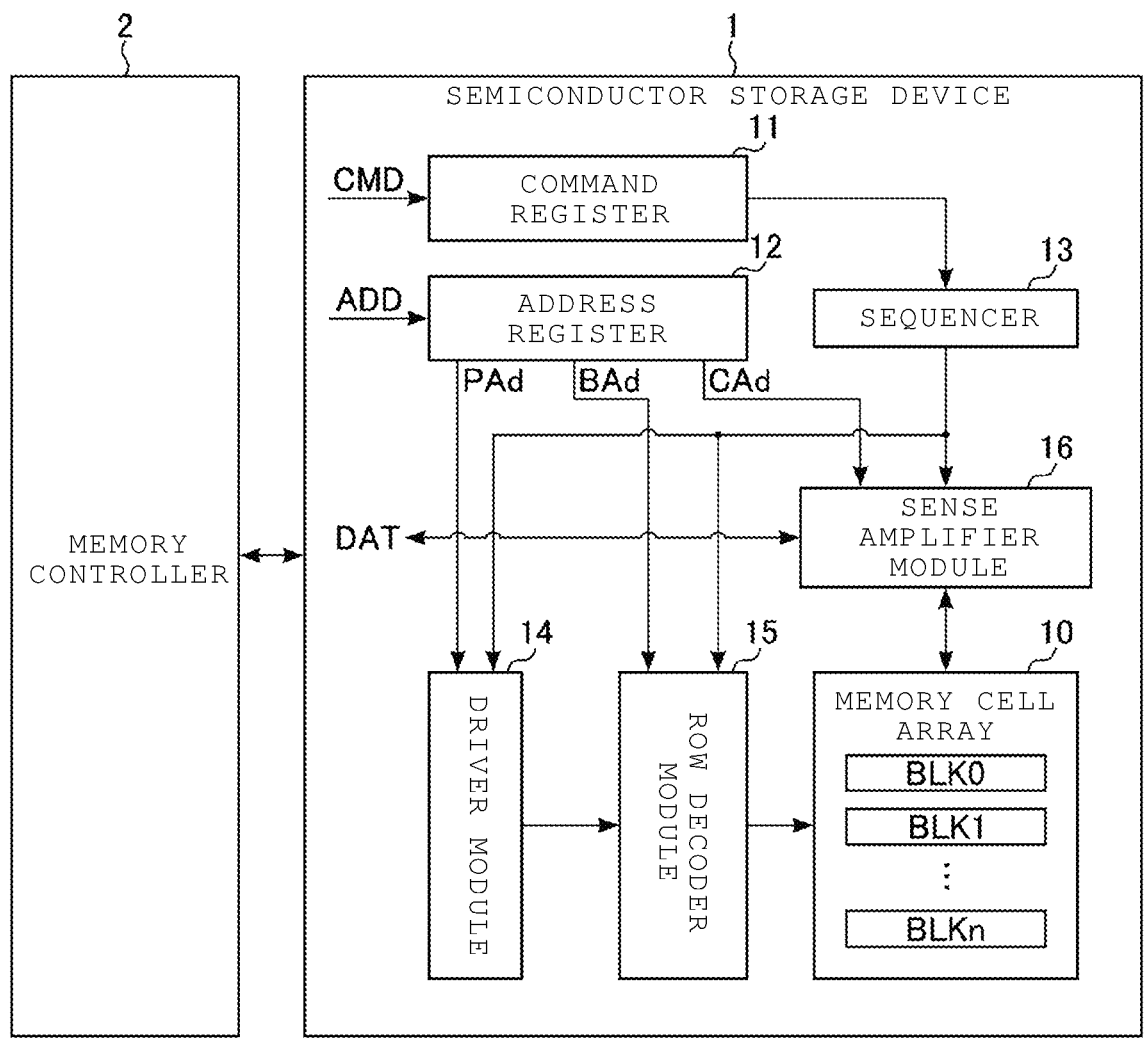
FIG. 1 illustrates a block view of a configuration example of a semiconductor storage device according to an embodiment.

FIG. 1 illustrates a configuration example of the semiconductor storage device 1 according to the embodiment. The semiconductor storage device 1 is a NAND flash memory capable of storing data in a nonvolatile manner and may be controlled by an external memory controller 2.

As illustrated in FIG. 1, the semiconductor storage device 1 includes, for example, a memory cell array 10, a command register 11, an address register 12, a sequencer 13, a driver module 14, a row decoder module 15, and a sense amplifier module 16.

The memory cell array 10 includes a plurality of blocks BLK0 to BLKn (where n is an integer of one or more). The block BLK is a set of a plurality of memory cells capable of storing data in a nonvolatile manner and is used as a data erasing unit, for example. The memory cell array 10 includes a plurality of bit lines and a plurality of word lines. Each memory cell is associated with, for example, one bit line and one word line. A detailed configuration of the memory cell array 10 will be described later.

The command register 11 stores a command CMD received from the memory controller 2 by the semiconductor storage device 1. The command CMD includes, for example, instructions that cause the sequencer 13 to execute a read operation, a write operation, an erase operation, and the like.

The address register 12 stores address information ADD received from the memory controller 2 by the semiconductor storage device 1. The address information ADD includes, for example, a block address BAd, a page address PAd, and a column address CAd. For example, the block address BAd, page address PAd, and column address CAd are used to select a block BLK, a word line, and a bit line, respectively.

The sequencer 13 controls the operation of the semiconductor storage device 1. For example, the sequencer 13 controls the driver module 14, the row decoder module 15, the sense amplifier module 16, and the like based on the command CMD stored in the command register 11 and executes a read operation, a write operation, an erase operation, and the like.

The driver module 14 generates a voltage used in a read operation, a write operation, an erase operation, and the like. The driver module 14 applies the generated voltage to the signal line corresponding to the selected word line based on the page address PAd stored in the address register 12, for example.

The row decoder module 15 selects one block BLK in the corresponding memory cell array 10 based on the block address BAd stored in the address register 12. For example, the row decoder module 15 transfers the voltage applied to the signal line corresponding to the selected word line to the selected word line in the selected block BLK.

In the write operation, the sense amplifier module 16 applies a desired voltage to each bit line according to the write data DAT received from the memory controller 2. In the read operation, the sense amplifier module 16 determines the data stored in the memory cell based on the voltage of the bit line and transfers the determination result to the memory controller 2 as read data DAT.

The semiconductor storage device 1 and the memory controller 2 described above may constitute one semiconductor device by a combination thereof. Examples of such a semiconductor device include a memory card such as an SD™ card and a solid-state drive (SSD).

[1-1-2] Circuit Configuration of Memory Cell Array 10

Figure 2:
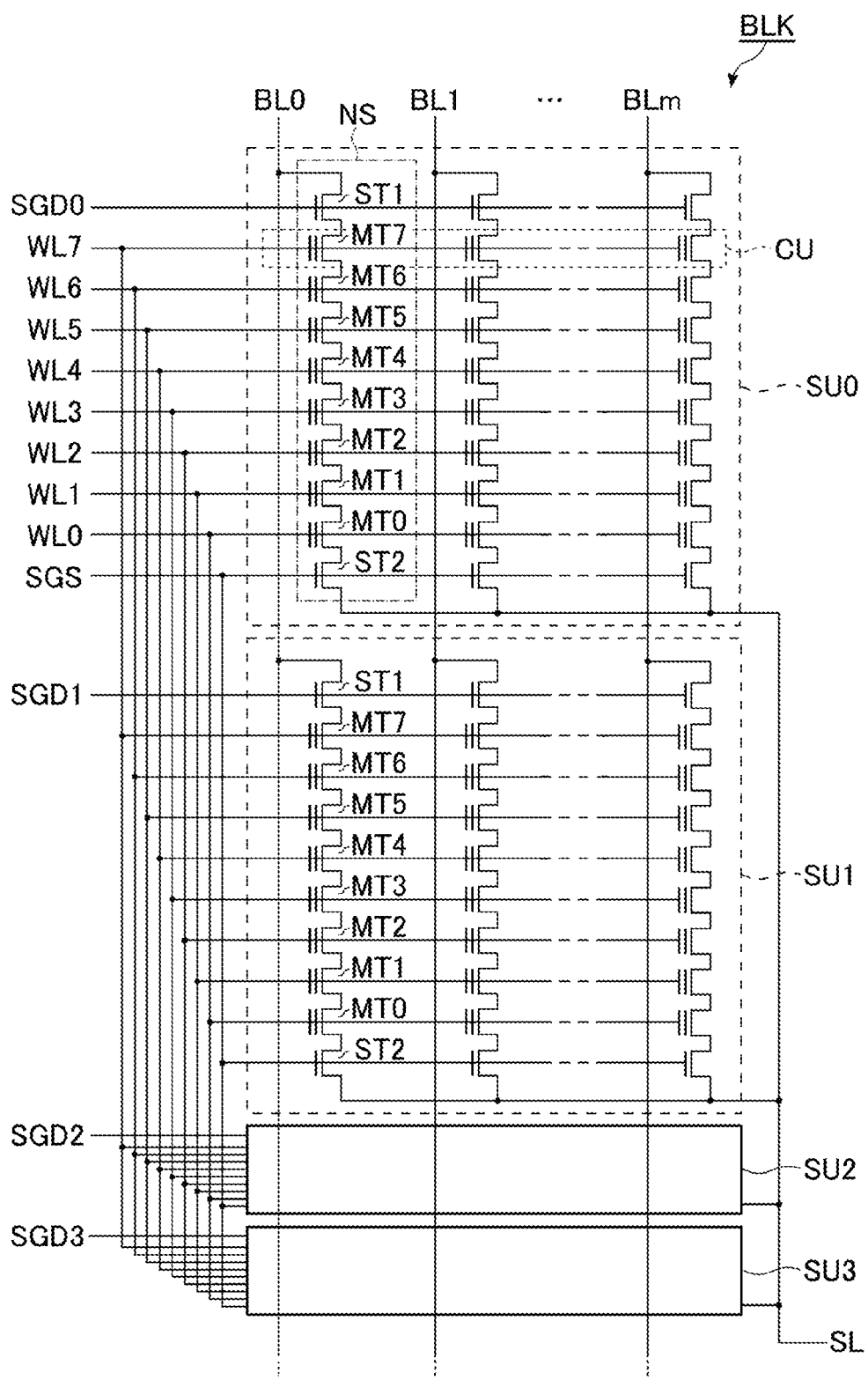
FIG. 2 is a circuit diagram of an example of a memory cell array in the semiconductor storage device according to an embodiment.

FIG. 2 illustrates an example of a circuit configuration of the memory cell array 10 in the semiconductor storage device 1 according to the embodiment, in which one block BLK is extracted from a plurality of blocks BLK in the memory cell array 10. As illustrated in FIG. 2, the block BLK includes, for example, four string units SU0 to SU3.

Each string unit SU includes a plurality of NAND strings NS respectively associated with bit lines BL0 to BLm (where m is an integer of one or more). Each NAND string NS includes, for example, memory cell transistors MT0 to MT7 and select transistors ST1 and ST2. The memory cell transistor MT includes a control gate and a charge storage layer and stores data in a nonvolatile manner. Each of the select transistors ST1 and ST2 is used to select the string unit SU during various operations.

In each NAND string NS, the memory cell transistors MT0 to MT7 are connected in series. The drain of the select transistor ST1 is connected to the associated bit line BL, and the source of the select transistor ST1 is connected to one end of the memory cell transistors MT0 to MT7 connected in series. The drain of the select transistor ST2 is connected to the other ends of the memory cell transistors MT0 to MT7 connected in series. The source of the select transistor ST2 is connected to a source line CELSRC.

In the same block BLK, the control gates of the memory cell transistors MT0 to MT7 are commonly connected to word lines WL0 to WL7, respectively. The gates of the select transistors ST1 in the string units SU0 to SU3 are commonly connected to select gate lines SGD0 to SGD3, respectively. The gates of the select transistors ST2 in the same block BLK are commonly connected to a select gate line SGS.

Different column addresses are assigned to the bit lines BL0 to BLm, respectively. Each bit line BL is shared by a NAND string NS to which the same column address is assigned among the plurality of blocks BLK. Each of the word lines WL0 to WL7 is provided for each block BLK. A source line SL is shared among the plurality of blocks BLK.

A set including a plurality of memory cell transistors MT connected to a common word line WL in one string unit SU is referred to as a cell unit CU, for example. For example, the storage capacity of the cell unit CU including the memory cell transistors MT each storing 1-bit data is defined as "one page data". The cell unit CU may have a storage capacity of two or more page data depending on the number of bits of data stored in the memory cell transistor MT.

The circuit configuration of the memory cell array 10 in the semiconductor storage device 1 according to a first embodiment is not limited to the specific configuration described above. For example, the number of string units SU in each block BLK, and the number of memory cell transistors MT and select transistors ST1 and ST2 in each NAND string NS may be freely selected.

[1-1-3] Structure of Semiconductor Storage Device 1

Hereinafter, an example of the structure of the semiconductor storage device 1 according to the embodiment will be described. In the drawings referenced below, an X direction corresponds to the extending direction of the word lines WL, a Y direction corresponds to the extending direction of the bit lines BL, and a Z direction corresponds to the vertical direction with respect to the surface of a semiconductor substrate 20 used for forming the semiconductor storage device 1. In the plan view, hatching may be appropriately added to make the drawing easier to understand. Any hatching added to a plan view is not necessarily related to the material and characteristics of the components to which the hatching is added. In the cross-sectional view, illustration of an interlayer insulating film and the like is generally omitted for easier understanding of the drawings.

(Planar Layout of Semiconductor Storage Device 1)

Figure 3:
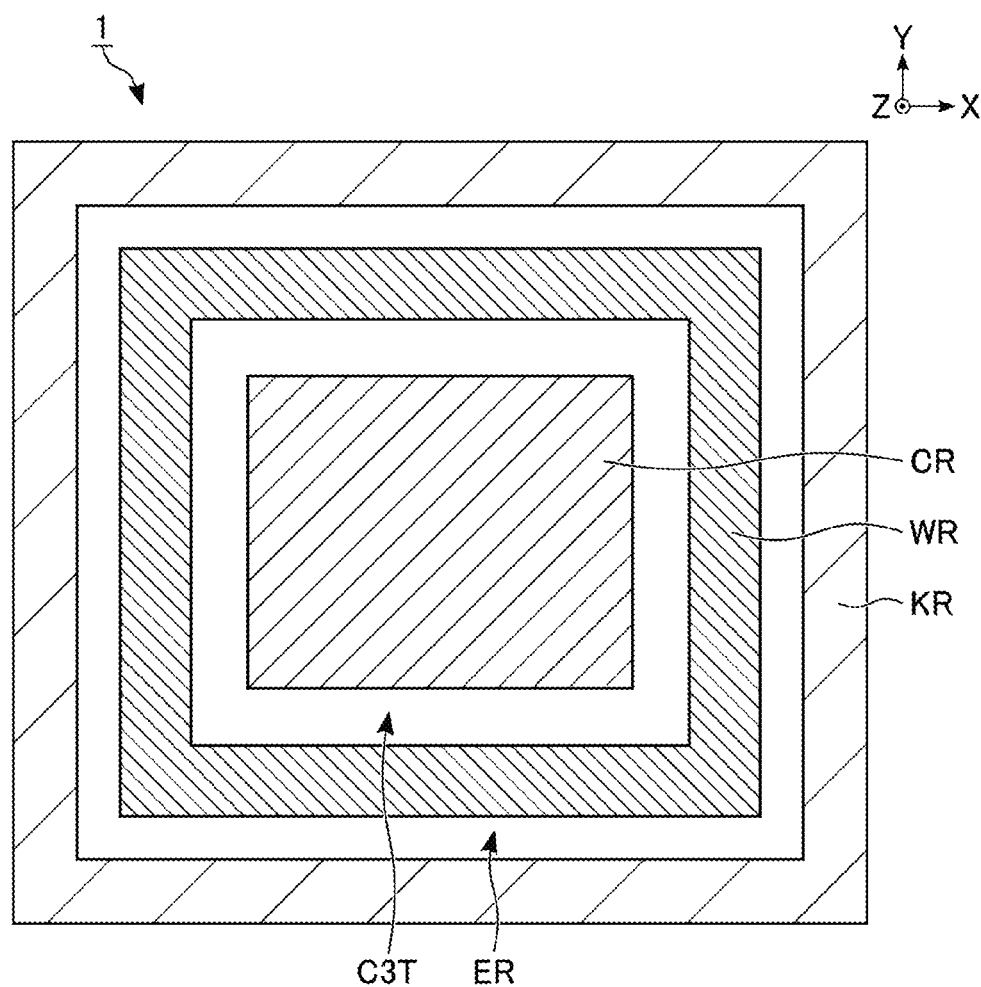
FIG. 3 illustrates a plan view of an example of the semiconductor storage device according to an embodiment.

FIG. 3 illustrates an example of a planar layout of the semiconductor storage device 1 according to the embodiment. As illustrated in FIG. 3, the planar layout of the semiconductor storage device 1 is divided into, for example, a core region CR, a wall region WR, a kerf region KR, a contact region C3T, and an end region ER.

The core region CR is a rectangular region provided in the central portion of a semiconductor substrate 20, for example. For example, the memory cell array 10 is provided in the core region CR. The core region CR may be arranged in any shape and any region. When the semiconductor storage device 1 includes a plurality of memory cell arrays 10, a plurality of core regions CR may be provided on the semiconductor substrate 20.

The wall region WR is a region having a rectangular ring shape provided to surround the outer periphery of the core region CR. For example, a crack stopper CS, which will be described later, is provided in the wall region WR. When a plurality of core regions CR are provided on the semiconductor substrate 20, the wall region WR may be provided to collectively surround the plurality of core regions CR or may be provided for each core region CR.

In the region surrounded by the wall region WR, for example, peripheral circuits such as the row decoder module 15 and the sense amplifier module 16 are formed. These peripheral circuits are allowed to overlap with the core region CR. Therefore, the semiconductor storage device 1 according to the embodiment has a structure in which the memory cell array 10 and the peripheral circuit are provided to overlap each other.

A region between the wall region WR and the core region CR corresponds to the contact region C3T. In the contact region C3T, for example, a contact for connecting the memory cell array 10 and the peripheral circuit is provided. For example, the row decoder module 15 is electrically connected to a wiring (for example, a word line WL) in the memory cell array 10 via a contact provided in the contact region C3T.

The kerf region KR is a region having a rectangular ring shape provided to surround the outer periphery of the wall region WR and is in contact with the outermost periphery of the semiconductor substrate 20. In the kerf region KR, for example, an alignment mark used when the semiconductor storage device 1 is manufactured, a guard ring, or the like is provided. A region between the kerf region KR and the wall region WR corresponds to the end region ER. The structure in the kerf region KR may be removed by a dicing process at the time of manufacturing the semiconductor storage device 1.

Figure 4:
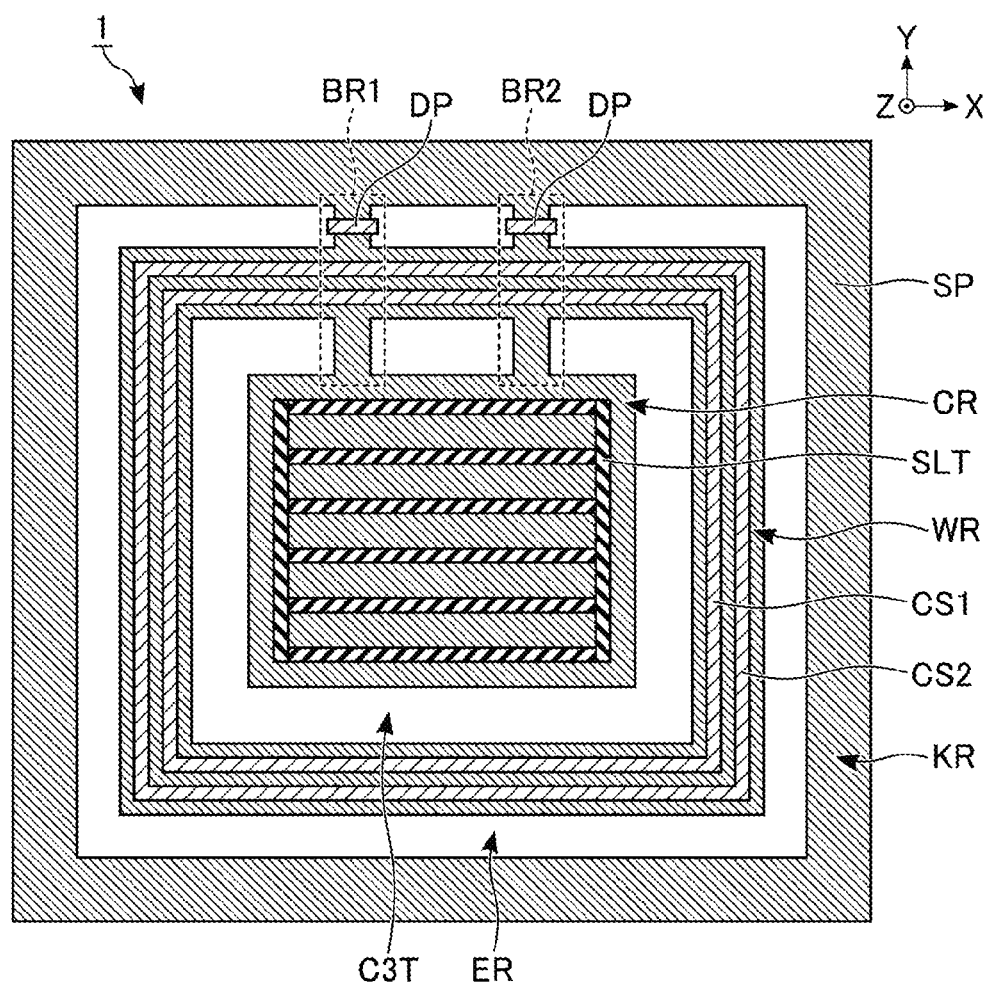
FIG. 4 illustrates a plan view of an example of the semiconductor storage device according to an embodiment.

The semiconductor storage device 1 according to the embodiment includes a stopper layer SP that is used as a countermeasure against arcing during etching. FIG. 4 illustrates an example of a planar layout of the stopper layer SP in the semiconductor storage device 1 according to the embodiment. As illustrated in FIG. 4, the semiconductor storage device 1 further includes the stopper layer SP, a slit SLT, crack stoppers CS1 and CS2, and a dividing portion DP.

The stopper layer SP is provided on the entire surface of the core region CR, the wall region WR, and the kerf region KR, for example. The stopper layer SP has a portion (hereinafter, referred to as a bridge portion BR) extending in the Y direction via the wall region WR between the core region CR and the kerf region KR. In this example, the case where the stopper layer SP has two bridge portions BR1 and BR2 is illustrated, but it is sufficient that at least one bridge portion BR is provided. The bridge portion BR may be arranged at any place.

The slit SLT is provided in the core region CR and has a portion extending in the Y direction and a portion extending in the X direction. Specifically, a plurality of slits SLT extending in the X direction are arranged in the Y direction. One of the two slits SLT extended in the Y direction is connected to one end of the plurality of slits SLT extended in the X direction, and the other of the two slits SLT extending in the Y direction is connected to the other end of the plurality of slits SLT extending in the X direction.

The slit SLT has a structure in which an insulating member is embedded therein, and is provided in the same wiring layer and divides adjacent conductor layers via the slit SLT. For example, the slit SLT divides a plurality of wiring layers respectively corresponding to the word lines WL0 to WL7 and the select gate lines SGD and SGS. In the embodiment, each of the regions surrounded by the slits SLT corresponds to one block BLK.

The crack stopper CS1 is provided in a rectangular ring shape so as to surround the outer periphery of the core region CR in the wall region WR. The crack stopper CS2 is provided in a rectangular ring shape so as to surround the outer periphery of the crack stopper CS1 in the wall region WR. The crack stopper CS divides the stopper layer SP provided in the wall region WR. The stopper layer SP adjacent via the crack stopper CS is insulated by the crack stopper CS. It is sufficient that at least one crack stopper CS is provided in the wall region WR. Each crack stopper CS may be divided and provided.

For example, in the dicing process, when a crack or the like occurs at the end of the semiconductor storage device 1, the crack stopper CS prevents the crack or the like from reaching inside the semiconductor storage device 1. The crack stopper CS prevents moisture and the like from penetrating from the end of the semiconductor storage device 1 into the core region CR. Further, the crack stopper CS reduces stress generated in the interlayer insulating film (for example, tetraethoxysilane (TEOS)) of the semiconductor storage device 1.

The dividing portion DP divides the stopper layer SP provided between the wall region WR and the kerf region KR. The stopper layer SP adjacent through the dividing portion DP is insulated by the dividing portion DP. In this example, the dividing portion DP is provided in each of a portion where the bridge portion BR1 and the end region ER overlap and a portion where the bridge portion BR2 and the end region ER overlap.

(Detailed Plane Layout in Core Region CR)

Figure 5:
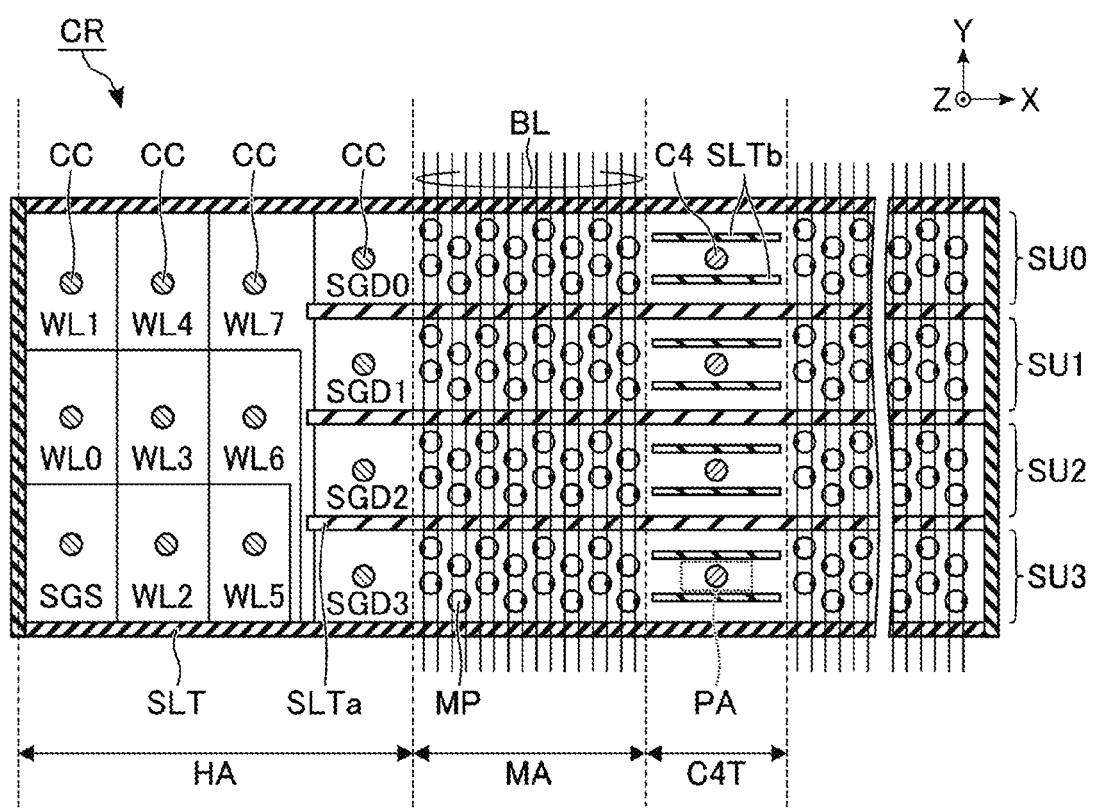
FIG. 5 illustrates a plan view of an example of a core region of a semiconductor storage device according to an embodiment.

FIG. 5 is an example of a planar layout in the core region CR of the semiconductor storage device 1 according to the embodiment and illustrates a region corresponding to one block BLK (that is, string units SU0 to SU3). As illustrated in FIG. 5, the core region CR includes, for example, a memory area MA, a lead area HA, and a contact region C4T. In the core region CR, the semiconductor storage device 1 includes slits SLTa and SLTb, a plurality of memory pillars MP, and a plurality of contacts CC and C4.

The memory area MA, the lead area HA, and the contact region C4T are provided to extend in the Y direction and are aligned in the X direction. The memory area MA occupies most of the core region CR. The lead area HA is provided at one end in the X direction. The contact region C4T is in the core region CA and divides the memory area MA in the X direction, for example. The lead area HA may be provided at both ends in the X direction, and the contact region C4T may be inserted into the lead area HA.

In the lead area HA, each of the select gate line SGS, the word lines WL0 to WL7, and the select gate line SGD has a portion (terrace portion) that does not overlap with the upper wiring layer (conductor layer). The shape of the portion not overlapping with the upper wiring layer is similar to a step, a terrace, a rimstone, or the like. Specifically, steps are provided between the select gate line SGS and the word line WL0, between the word line WL0 and the word line WL1, . . . between the word line WL6 and the word line WL7, and between the word line WL7 and the select gate line SGD.

Each of the plurality of slits SLTa is provided to extend along the X direction and is disposed between adjacent slits SLT in the Y direction. For example, three slits SLTa are arranged in the Y direction between adjacent slits SLT. The slit SLTa has a structure in which an insulating member is embedded therein, and is provided in the same wiring layer and divides adjacent conductor layers via the slit SLTa. The slit SLTa divides at least the conductor layer corresponding to the select gate line SGD, and four select gate lines SGD0 to SGD3 are provided between the adjacent slits SLT.

A plurality of slits SLTb are provided to extend in the X direction in the contact region C4T. For example, a set of two slits SLTb is disposed between the slits SLT and SLTa and between the two slits SLTa. A penetrating area PA is provided in a part between the pair of two slits SLTb. The structure of the memory cell array 10 in the penetrating area PA is different from the structure of the memory cell array 10 in other regions. Details of the structure in the penetrating area PA will be described later.

Each of the plurality of memory pillars MP functions as one NAND string NS, for example, and is provided in the memory area MA. The plurality of memory pillars MP are disposed in, for example, four rows of staggered patterns in the respective regions between the adjacent slits SLT and SLTa and between the two adjacent slits SLTa. The present disclosure is not limited thereto, and the number and arrangement of the memory pillars MP between adjacent slits may be changed as a design choice.

In each of the memory pillars MP, at least one bit line BL overlaps with each string unit SU. For example, the plurality of bit lines BL are at least partially extended in the Y direction and arranged in the X direction. In this example, in each memory pillar MP, two bit lines BL are disposed so as to overlap each other, and among the plurality of bit lines BL overlapping with the memory pillar MP, one bit line BL and the memory pillar MP are electrically connected.

The plurality of contacts CC are disposed in the respective terrace portions of the select gate line SGS, the word lines WL0 to WL7, and the select gate line SGD in the lead area HA. The select gate line SGS, the word lines WL0 to WL7, and the select gate line SGD are electrically connected to the row decoder module 15 via corresponding contacts CC. As described above, the lead area HA is used for connection between the row decoder module 15 and the stacked wiring (for example, the word line WL and the select gate lines SGS and SGD) connected to the NAND string NS.

The plurality of contacts C4 are contacts penetrating a region where the memory cell array 10 is formed in the contact region C4T. Specifically, each of the plurality of contacts C4 is provided in the penetrating area PA between the adjacent slits SLTb. The contact C4 is used for supplying power to a circuit provided under the memory cell array 10, for example. The number of contacts C4 provided in the penetrating area PA may be more than or equal to two.

In the planar layout in the core region CR of the semiconductor storage device 1 described above, each of the regions delimited by the slits SLT and SLTa corresponds to one string unit SU. That is, the string units SU0 to SU3 each extending in the X direction are arranged in the Y direction, and in the core region CR, for example, a layout corresponding to one block BLK illustrated in FIG. 5 is repeatedly arranged in the Y direction. One memory pillar MP is electrically connected to one bit line BL for each space defined by the slits SLT and SLTa.

(Cross-Sectional Structure in Memory Area MA)

Figure 6:
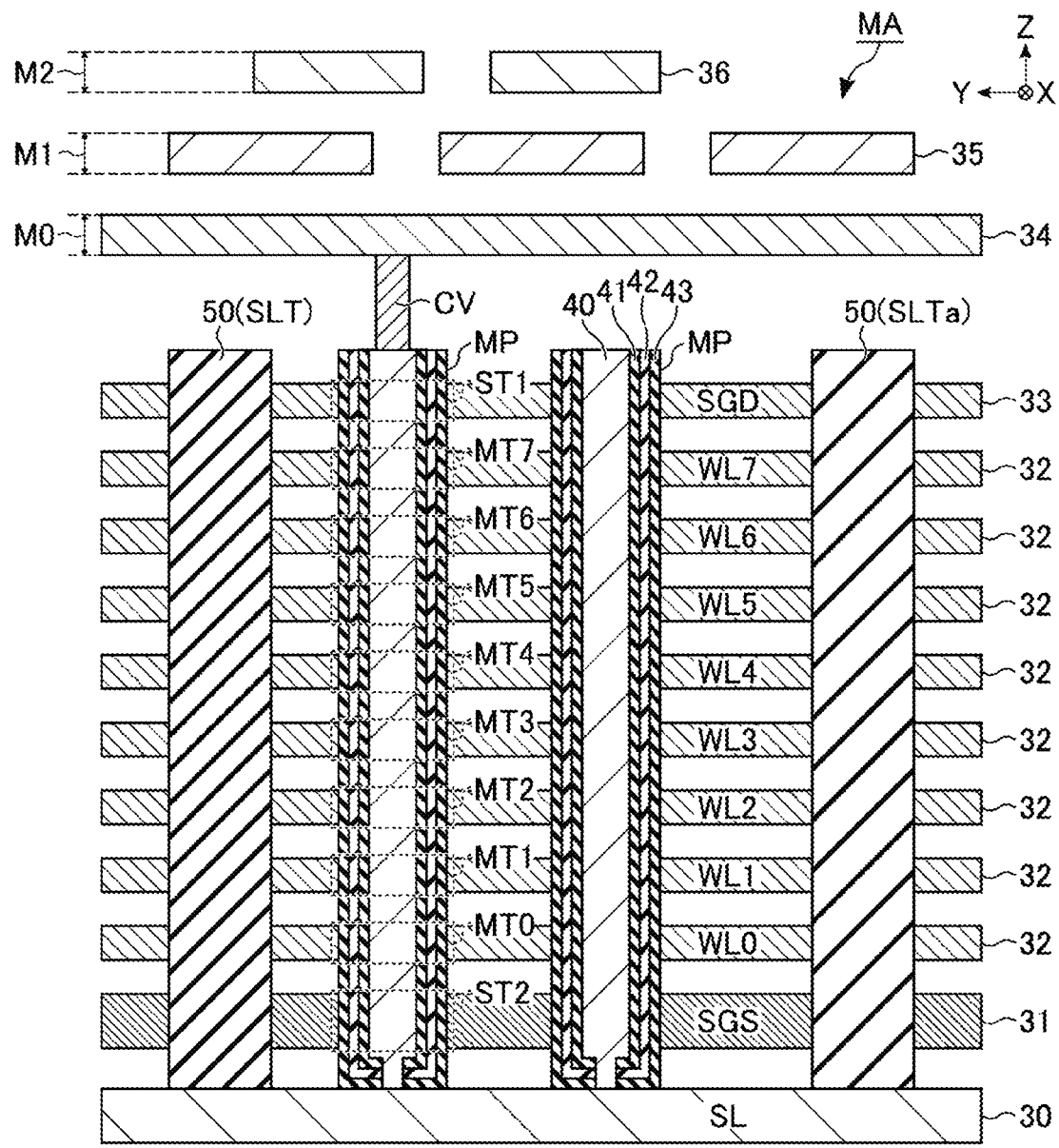
FIG. 6 illustrates a cross-sectional view of an example of a memory area of a semiconductor storage device according to an embodiment.
Figure 6:
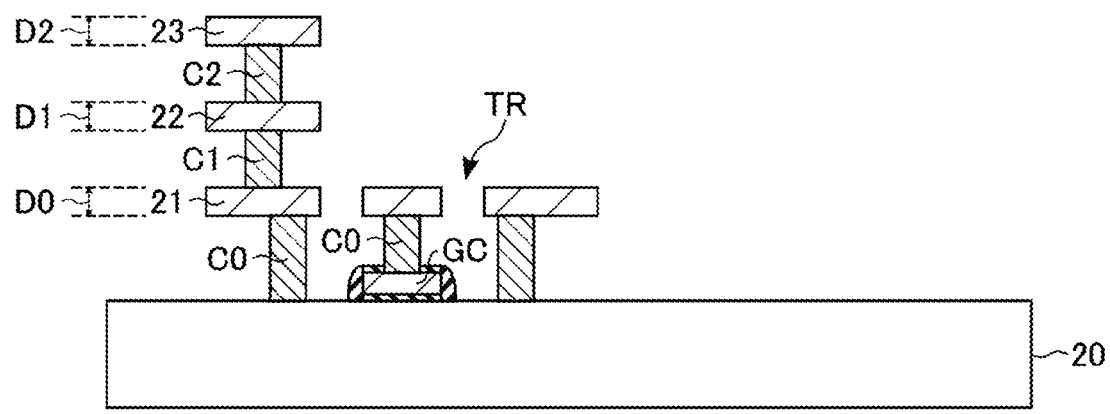

FIG. 6 illustrates an example of a cross-sectional structure in the memory area MA of the semiconductor storage device 1 according to the embodiment. As illustrated in FIG. 6, in the memory area MA, the semiconductor storage device 1 includes conductor layers GC and 21 to 23, conductor layers 30 to 36, a memory pillar MP, contacts C0 and CV, and an insulating member 50.

The conductor layer GC is provided on the semiconductor substrate 20 via a gate insulating film. The conductor layer GC functions as a gate electrode of a transistor TR provided under the memory cell array 10. The plurality of contacts C0 are provided on the conductor layer GC and the semiconductor substrate 20, respectively. The contact C0 provided on the semiconductor substrate 20 is connected to an impurity diffusion region on the semiconductor substrate 20.

The conductor layer 21 is provided on the contact C0. A contact C1 is provided on the conductor layer 21. A conductor layer 22 is provided on the contact C1. A contact C2 is provided on the conductor layer 22. The conductor layer 23 is provided on the contact C2. Hereinafter, the three wiring layers provided with the conductor layers 21 to 23 will be referred to as wiring layers D0 to D2, respectively.

The conductor layer 30 is provided above the conductor layer 23 via an interlayer insulating film. For example, the conductor layer 30 is formed in a plate shape extending along the XY plane and is used as the source line SL. The conductor layer 30 includes, for example, polysilicon doped with phosphorus.

The conductor layer 31 is provided above the conductor layer 30 via an interlayer insulating film. The conductor layer 31 is formed, for example, in a plate shape extending along the XY plane and is used as the select gate line SGS. The conductor layer 31 corresponds to the stopper layer SP described above. The conductor layer 31 contains, for example, polysilicon doped with phosphorus. The impurity doped in the conductor layer 31 may be boron or arsenic.

A plurality of conductor layers 32 are provided above the conductor layer 31 via an interlayer insulating film. The plurality of conductor layers 32 are stacked along the Z direction, and an interlayer insulating film is provided between adjacent conductor layers 32. For example, the conductor layer 32 is formed in a plate shape extending along the XY plane. The plurality of stacked conductor layers 32 are used as the word lines WL0 to WL7 in order from the semiconductor substrate 20 side. The conductor layer 32 contains, for example, tungsten.

A conductor layer 33 is provided above the uppermost conductor layer 32 via an interlayer insulating film. The conductor layer 33 is formed in, for example, a plate shape extending along the XY plane and is used as the select gate line SGD. The conductor layer 33 contains, for example, tungsten.

A conductor layer 34 is provided above the conductor layer 33 via an interlayer insulating film. The conductor layer 34 is formed in, for example, a line extending in the Y direction and is used as the bit line BL. That is, in the region not illustrated, a plurality of conductor layers 26 are arranged along the X direction. The conductor layer 34 contains, for example, copper.

A conductor layer 35 is provided above the conductor layer 34 via an interlayer insulating film. A conductor layer 36 is provided above the conductor layer 35 via an interlayer insulating film. The conductor layers 35 and 36 are wirings used for connection between circuits in the semiconductor storage device 1, power supply, and the like. Hereinafter, the three wiring layers provided with the conductor layers 34 to 36 are referred to as wiring layers M0 to M2, respectively.

Each of the memory pillars MP is provided in a columnar shape extending along the Z direction. The memory pillar MP passes through the conductor layers 31 to 33, and the bottom of the memory pillar MP is in contact with the conductor layer 30. Each of the memory pillars MP includes a semiconductor layer 40, a tunnel insulating film 41, an insulating film 42, and a block insulating film 43, for example.

The semiconductor layer 40 is provided extending along the Z direction. For example, the upper end of the semiconductor layer 40 is located upper than the conductor layer 33, and the lower end of the semiconductor layer 40 is in contact with the conductor layer 30. The tunnel insulating film 41 covers the side surface of the semiconductor layer 40. The insulating film 42 covers the side surface of the tunnel insulating film 41. The block insulating film 43 covers the side surface of the insulating film 42. Each of the tunnel insulating film 41 and the block insulating film 43 contains, for example, silicon oxide ($SiO_2$). The insulating film 42 contains, for example, silicon nitride (SiN).

A portion where the memory pillar MP and the conductor layer 31 intersect functions as the select transistor ST2. A portion where the memory pillar MP and the conductor layer 32 intersect functions as the memory cell transistor MT. A portion where the memory pillar MP and the conductor layer 33 intersect functions as the select transistor ST1. That is, the semiconductor layer 40 functions as a channel for each of the memory cell transistors MT0 to MT7 and the select transistors ST1 and ST2. The insulating film 42 functions as a charge storage layer of the memory cell transistor MT.

The contact CV is provided on the semiconductor layer 40 in the memory pillar MP. One conductor layer 34, that is, one bit line BL is in contact with the upper surface of the contact CV. In the illustrated region, the contact CV corresponding to one memory pillar MP of the two memory pillars MP is displayed. The contact CV is connected to the memory pillar MP in a region not illustrated where the contact CV is not connected in the region.

The insulating member 50 is formed, for example, in a plate shape extending along the XZ plane and divides the conductor layers 31 to 33. The upper end of the insulating member 50 is located in the layer between the conductor layers 33 and 34. A part of the lower end of the insulating member 50 is in contact with the conductor layer 30. The insulating member 50 corresponds to the slit SLT or SLTa. The insulating member 50 corresponding to the slit SLTa only needs to divide at least the conductor layer 33.

In the structure in the memory area MA of the semiconductor storage device 1 described above, the structure between the slits SLT and SLTa corresponds to one string unit SU. As described above, one contact CV is connected to one conductor layer 34 (one bit line BL) for each space defined by the slits SLT and SLTa. A line-shaped contact may be formed in the slit SLT. In this case, the line-shaped contact is connected to the source line SL, and the contact and the conductor layers 31 to 33 are insulated.

(Cross-Sectional Structure in Lead Area HA and Contact Region C4T)

Figure 7:
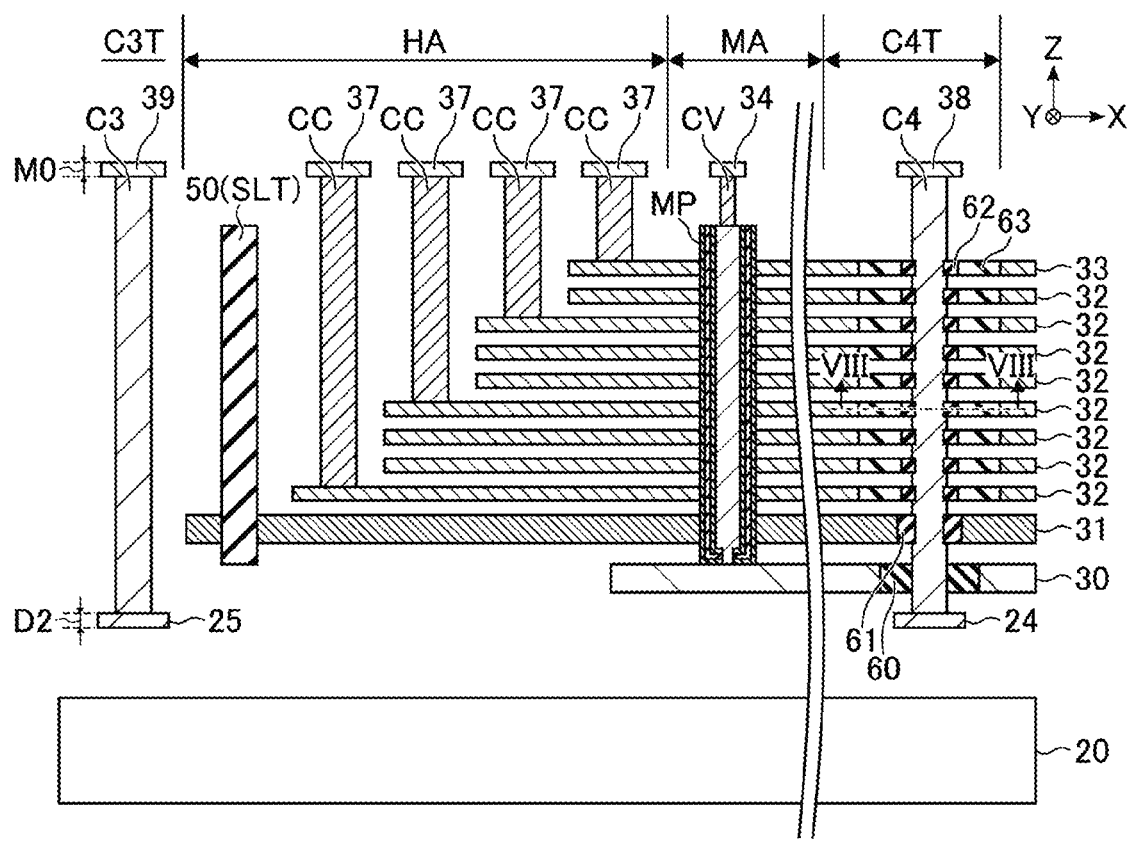
FIG. 7 illustrates a cross-sectional view of an example of a core region of a semiconductor storage device according to an embodiment.

FIG. 7 illustrates an example of a cross-sectional structure in the lead area HA and the contact region C4T of the semiconductor storage device 1 according to the embodiment. FIG. 7 also illustrates a part of the contact region C3T adjacent to the lead area HA. As illustrated in FIG. 7, for example, the semiconductor storage device 1 includes the contact CC and a conductor layer 37 in the lead area HA, the contact C4 and conductor layers 24 and 38 in the contact region C4T, and a contact C3 and conductor layers 25 and 39 in the contact region C3T.

In the lead area HA, the end portions of the plurality of conductor layers corresponding to the word lines WL and the select gate lines SGD and SGS are provided, for example, in a step shape. One contact CC is provided on each terrace portion of the conductor layer 31 corresponding to the select gate line SGS, a plurality of conductor layers 32 corresponding to the word lines WL0 to WL7, respectively, and the conductor layer 33 corresponding to the select gate line SGD. FIG. 7 illustrates four contacts CC corresponding to the word lines WL0, WL3, and WL6 and the select gate line SGD among the plurality of contacts CC.

One conductor layer 37 is provided on each contact CC, and the contact CC and the conductor layer 37 are electrically connected. The conductor layer 37 is located in the same layer (wiring layer M0) as the conductor layer 34, for example. In this example, the case where the stacked wiring such as the word lines WL provided in the lead area HA has a three-step staircase structure is illustrated, while the stacked wiring in the lead area HA may be provided in a step shape with any number of columns. The formed staircase structure may be different among the select gate line SGS, the word line WL, and the select gate line SGD. The conductor layer 37 may be provided in a layer different from the conductor layer 34.

In the contact region C4T, the conductor layer 24 is provided in the wiring layer D2. The contact C4 is provided on the conductor layer 24. The contact C4 is provided in a columnar shape extending in the Z direction and penetrates the wiring layer corresponding to the conductor layers 30 to 33. The contact C4 includes a conductor and is insulated from the conductor layers 30 to 33.

Specifically, an insulator layer 60 is provided between the contact C4 and the conductor layer 30. An oxide film 61 is provided between the contact C4 and the conductor layer 31. The oxide film 61 contains, for example, phosphorus, boron, or arsenic. An oxide film 62 and a sacrificial member 63 are provided between the contact C4 and the conductor layers 32 and 33. The oxide film 62 is provided between the contact C4 and the sacrificial member 63. The sacrificial member 63 is provided in the penetrating area PA and corresponds to a sacrificial member that is not replaced in the stacked wiring replacement processing described below. That is, the sacrificial member remains even after such replacement processing. The sacrificial member 63 contains, for example, silicon nitride (SiN).

The outer diameter of the contact C4 is small in each of the portion facing the oxide film 61 and the portion facing the oxide film 62. In other words, the side surface of the contact C4 is provided in a recess shape in each of the portion facing the oxide film 61 and the portion facing the oxide film 62. Further, in other words, the contact C4 is bundled in each of the portion facing the oxide film 61 and the portion facing the oxide film 62.

The conductor layer 38 is provided on the contact C4. As a result, the conductor layer 24 provided below the stacked wiring such as the word line WL and the conductor layer 38 provided above the stacked wiring are electrically connected via the contact C4. The conductor layer 38 is located in the same layer (wiring layer M0) as the conductor layer 34, for example. The conductor layer 38 may be provided in a layer different from the conductor layer 34.

In the contact region C3T, the conductor layer 25 is provided in the wiring layer D2. The contact C3 is provided on the conductor layer 25. The contact C3 is provided in a columnar shape extending in the Z direction. For example, the upper end of the contact C3 is aligned with the upper end of the contact C4. The conductor layer 39 is provided on the contact C3. As a result, the conductor layer 25 provided below the stacked wiring such as the word line WL and the conductor layer 39 provided above the stacked wiring are electrically connected via the contact C4. The conductor layer 39 is located in the same layer (wiring layer M0) as the conductor layer 34, for example. The conductor layer 39 may be provided in a layer different from the conductor layer 34.

Figure 8:
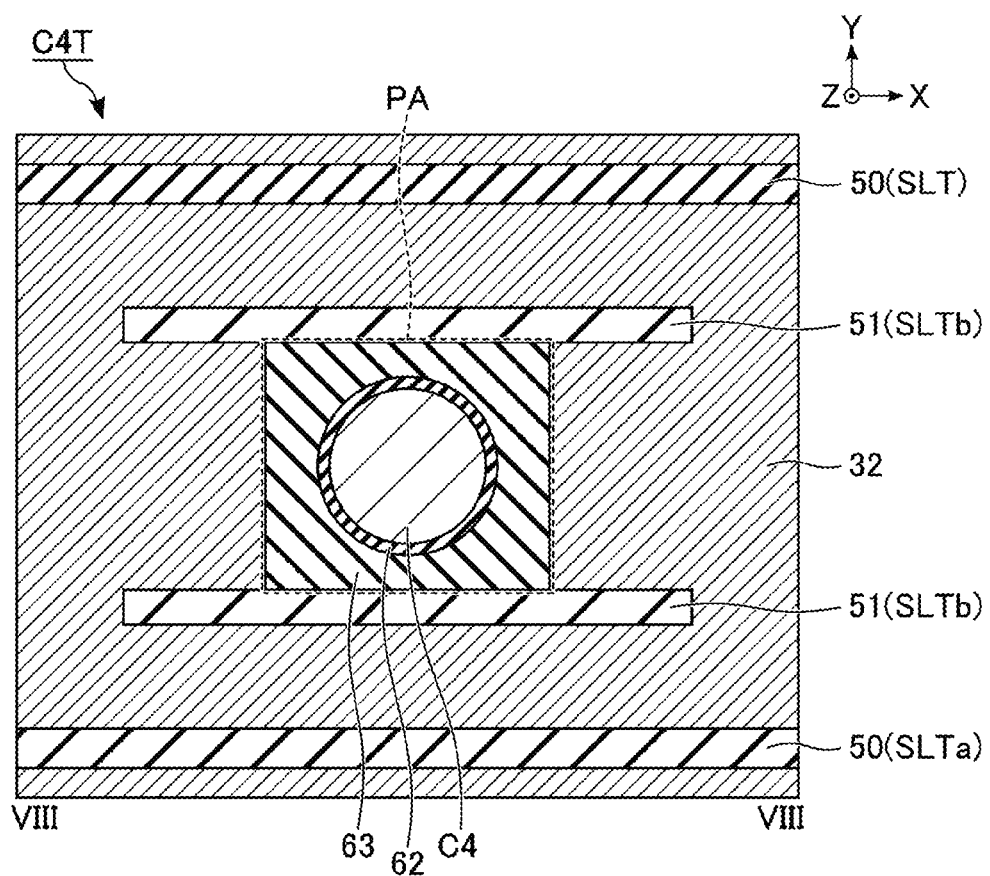
FIG. 8 illustrates a cross-sectional view of an example of a through region of a semiconductor storage device according to an embodiment.

FIG. 8 illustrates a cross-sectional view, taken along line VIII-VIII in FIG. 7, of an example of the contact region C4T of the semiconductor storage device 1 according to the embodiment, and corresponds to a cross section including the conductor layer 32 corresponding to the word line WL. As shown in FIG. 8, two insulating members 51 corresponding to the slits SLTb are provided between the two insulating members 50 corresponding to the slits SLT and SLTa, respectively.

Although not illustrated, the structure of the insulating member 51 is the same as that of the insulating member 50, for example. That is, the insulating member 51 divides the conductor layers 31 to 33. The upper end of the insulating member 50 is located in the layer between the conductor layers 33 and 34. A part of the lower end of the insulating member 50 is in contact with the conductor layer 30. The penetrating area PA is disposed between the two insulating members 51.

The penetrating area PA includes the contact C4, the oxide film 62, and the sacrificial member 63. For example, the contact C4 is disposed in the central portion of the penetrating area PA. The oxide film 62 covers the side surface of the contact C4. In the wiring layer in which the conductor layer 32 or 33 is provided in the penetrating area PA, the sacrificial member 63 is provided outside the region where the contact C4 and the oxide film 62 are provided. The sacrificial member 63 is in contact with each of the two insulating members 51 adjacent to the penetrating area PA. The sacrificial member 63 is in contact with the conductor layer 32 except for the portion in contact with the insulating member 51.

(Cross-Sectional Structure in Wall Region WR and End Region ER)

Figure 9:
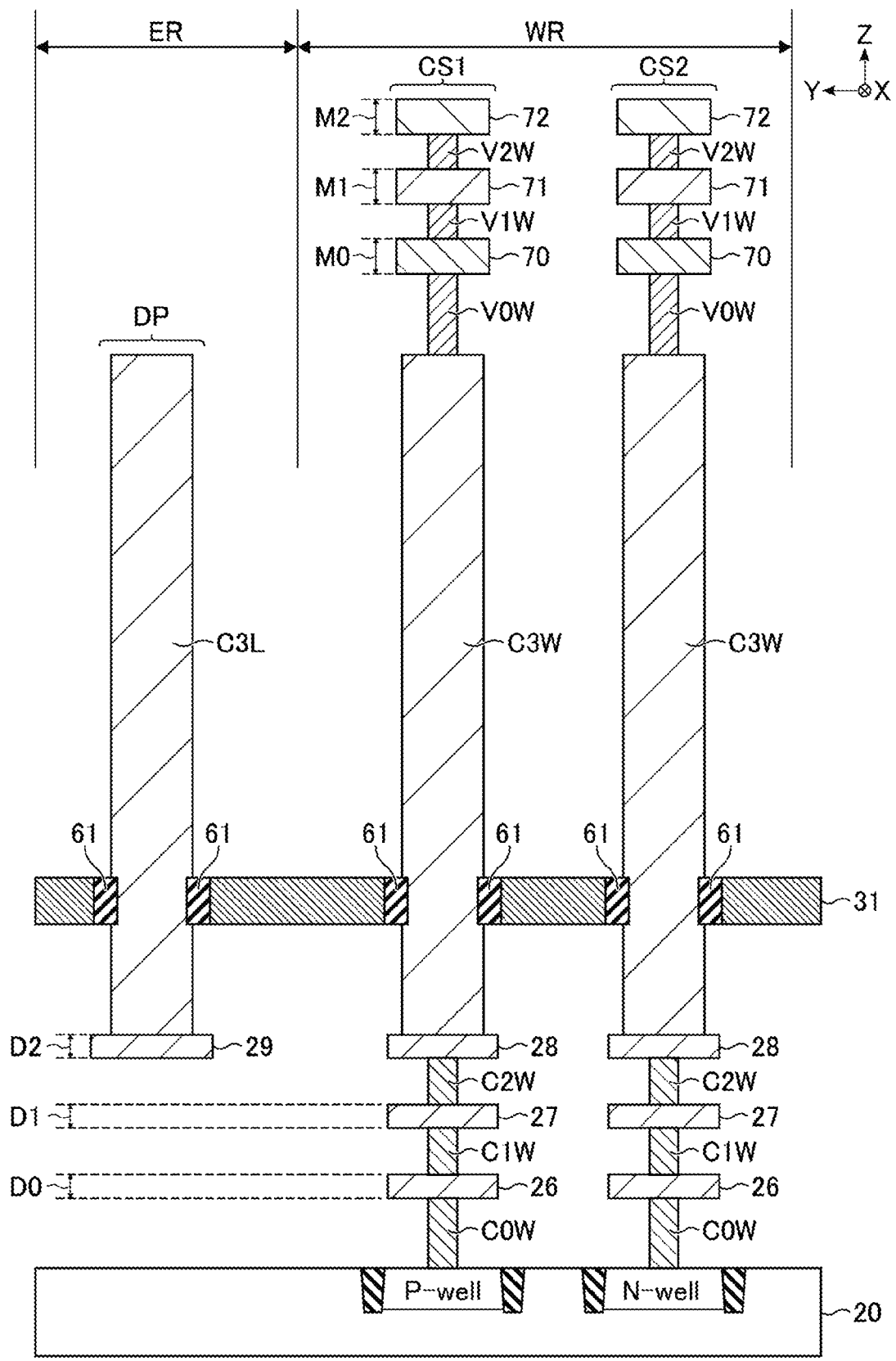
FIG. 9 illustrates a cross-sectional view of an example of a wall region and an end region in a semiconductor storage device according to an embodiment.

FIG. 9 illustrates an example of a cross-sectional structure in the wall region WR and the end region ER of the semiconductor storage device 1 according to the embodiment and corresponds to a cross section in the bridge portion BR along the Y direction. As illustrated in FIG. 9, the semiconductor storage device 1 includes the crack stoppers CS1 and CS2 in the wall region WR and includes a dividing portion DP in the end region ER.

Near the surface of the semiconductor substrate 20 in the wall region WR, for example, a P-type well region (also referred to as a "P-well") provided corresponding to the crack stopper CS1 and an N-type well region (also referred to as a "N-well") provided corresponding to the crack stopper CS2 are located. Each of the crack stoppers CS1 and CS2 includes contacts C0W, C1W, C2W, and C3W, the conductor layers 26 to 28, contacts V0W, V1W, and V2W, and conductor layers 70 to 72.

The contact C0W of the crack stopper CS1 is provided on the P-type well region. The contact C0W of the crack stopper CS2 is provided on the N-type well region. Since the other structures of the crack stoppers CS1 and CS2 are the same, the following description will be given focusing on the crack stopper CS1.

The conductor layer 26 is provided on the contact C0W. The contact C1W is provided on the conductor layer 26. The conductor layer 27 is provided on the contact C1W. The contact C2W is provided on the conductor layer 27. The conductor layer 28 is provided on the contact C2W. The conductor layers 26 to 28 are located in the wiring layers D0 to D2, respectively.

The contact C3W is provided on the conductor layer 28. The contact C3W is provided extending in the Z direction and divides the wiring layer provided with the conductor layer 31. The oxide film 61 is provided between the contact C3W and the conductor layer 31, and the contact C3W and the conductor layer 31 are insulated. The oxide film 61 is not in contact with the contact C3W in the wiring layer including the plurality of conductor layers 32 corresponding to the word line WL. In other words, the oxide film 61 is not provided on the side surface of the contact C3W in the layers other than the stopper layer SP. The upper surface of the contact C3W is aligned with the upper surface of the contact C3 illustrated in FIG. 7.

The contact V0W is provided on the contact C3W. The conductor layer 70 is provided on the contact V0W. The contact V1W is provided on the conductor layer 70. The conductor layer 71 is provided on the contact V1W. The contact V2W is provided on the conductor layer 71. The conductor layer 72 is provided on the contact V2W. The conductor layers 70 to 72 are located in the wiring layers M0 to M2, respectively.

In the end region ER, the dividing portion DP includes a conductor layer 29 and a contact C3L. The conductor layer 29 is provided, for example, on the wiring layer D2. The contact C3L is provided on the conductor layer 29. The contact C3L is provided extending in the Z direction and divides the wiring layer provided with the conductor layer 31. The oxide film 61 is provided between the contact C3L and the conductor layer 31, and the contact C3L and the conductor layer 31 are insulated. The upper surface of the contact C3L is aligned with the upper surface of the contact C3W, for example.

Figure 10:
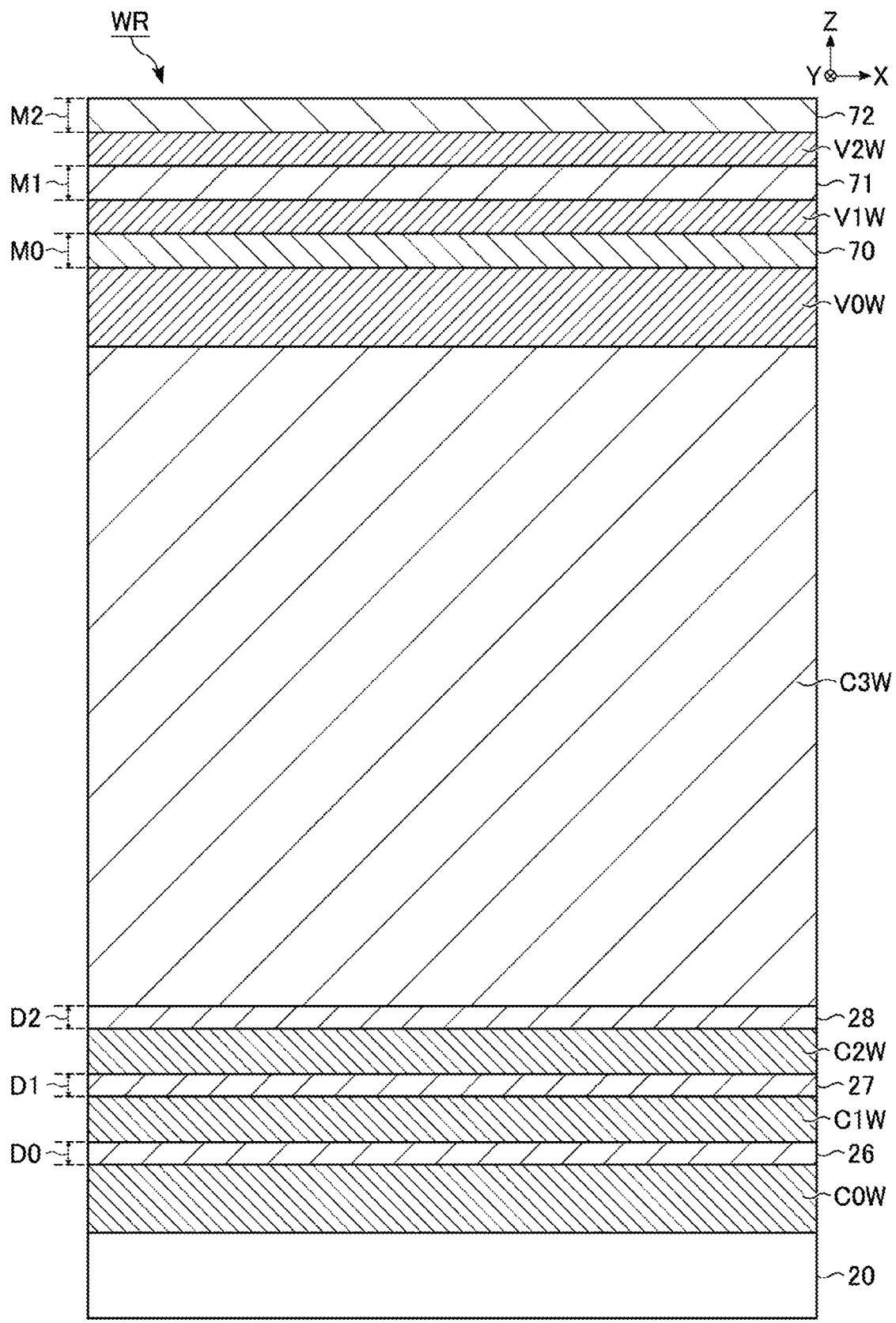
FIG. 10 illustrates a cross-sectional view of an example of a crack stopper in a semiconductor storage device according to an embodiment.

FIG. 10 illustrates an example of a cross-sectional structure in the wall region WR of the semiconductor storage device 1 according to the embodiment and corresponds to a cross section of the crack stopper CS that intersects the bridge portion BR along the X direction. As illustrated in FIG. 10, each of the contacts C0W, C1W, C2W, C3W, V0W, V1W, and V2W and the conductor layers 26 to 28 and 70 to 72 in the crack stopper CS has a portion extending in the X direction.

In regions not illustrated, each of the contacts C0W, C1W, C2W, C3W, V0W, V1W, and V2W and the conductor layers 26 to 28 and 70 to 72 in the crack stopper CS also has a portion extending in the Y direction. Thereby, each of the contacts C0W, C1W, C2W, C3W, V0W, V1W, and V2W in the crack stopper CS and the conductor layers 26 to 28 and 70 to 72 are provided in, for example, a rectangular ring shape and surrounds the core region CR. The crack stopper CS may also be regarded as a wall between the core region CR and the kerf region KR.

Figure 11:
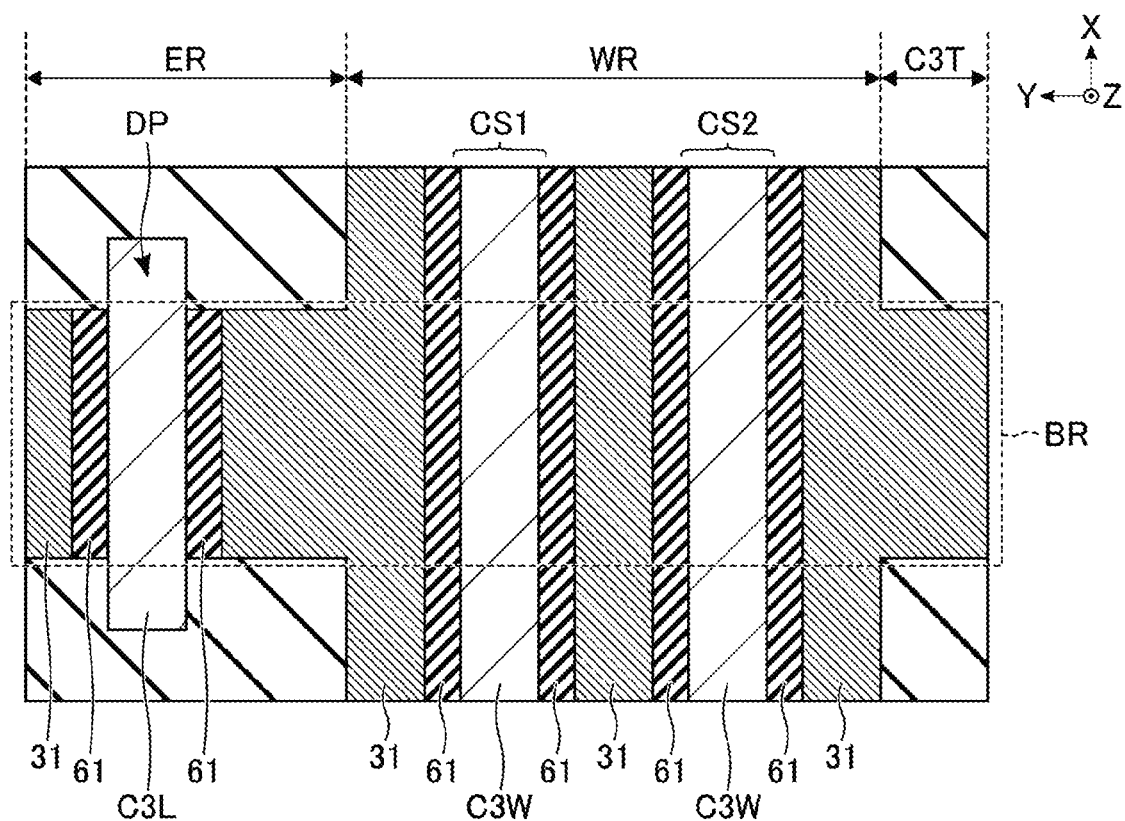
FIG. 11 illustrates a cross-sectional view of an example of a bridge region of a semiconductor storage device according to an embodiment.

FIG. 11 illustrates an example of a cross-sectional structure including the bridge portion BR of the semiconductor storage device 1 according to the embodiment and corresponds to a cross section including the conductor layer 31 corresponding to the stopper layer SP. As illustrated in FIG. 11, the conductor layer 31 has a portion extending along the Y direction in the bridge portion BR and has a portion extending along the X direction in the wall region WR.

The conductor layer 31 provided in the wall region WR is divided by the contact C3W in the crack stoppers CS1 and CS2. The oxide film 61 is provided between the contact C3W corresponding to the crack stopper CS1 and the conductor layer 31, and between the contact C3W corresponding to the crack stopper CS2 and the conductor layer 31, respectively.

The conductor layer 31 provided in the end region ER is divided by the contact C3L in the dividing portion DP. The oxide film 61 is provided between the contact C3L and the conductor layer 31. The contact C3L crosses at least the bridge portion BR. The oxide film 61 is not formed on the side surface of the contact C3L other than the layer provided with the conductor layer 31, for example.

The conductor layer 31 in the kerf region KR and the conductor layer 31 in the core region CR are insulated by the crack stopper CS and the dividing portion DP described above. A plurality of dividing portions DP may be provided. The dividing portion DP may be omitted as long as the voltage applied to the kerf region KR may be cut off by the crack stopper CS. In other words, the dividing portion DP may be omitted as long as a sufficient breakdown voltage may be secured.

In the semiconductor storage device 1 according to the embodiment, when two or more crack stoppers CS corresponding to the N-type well region or the P-type well region are provided, the conductor layer 72 may be shared between a plurality of crack stoppers CS connected to the same type of well region. As a material used for the conductor layer and the contact in the crack stopper CS, for example, a metal material such as titanium, titanium nitride, or tungsten is used. However, the present disclosure is not limited thereto, and any metal material may be used for the crack stopper CS.

[1-2] Manufacturing Method of Semiconductor Storage Device 1

Figure 12:
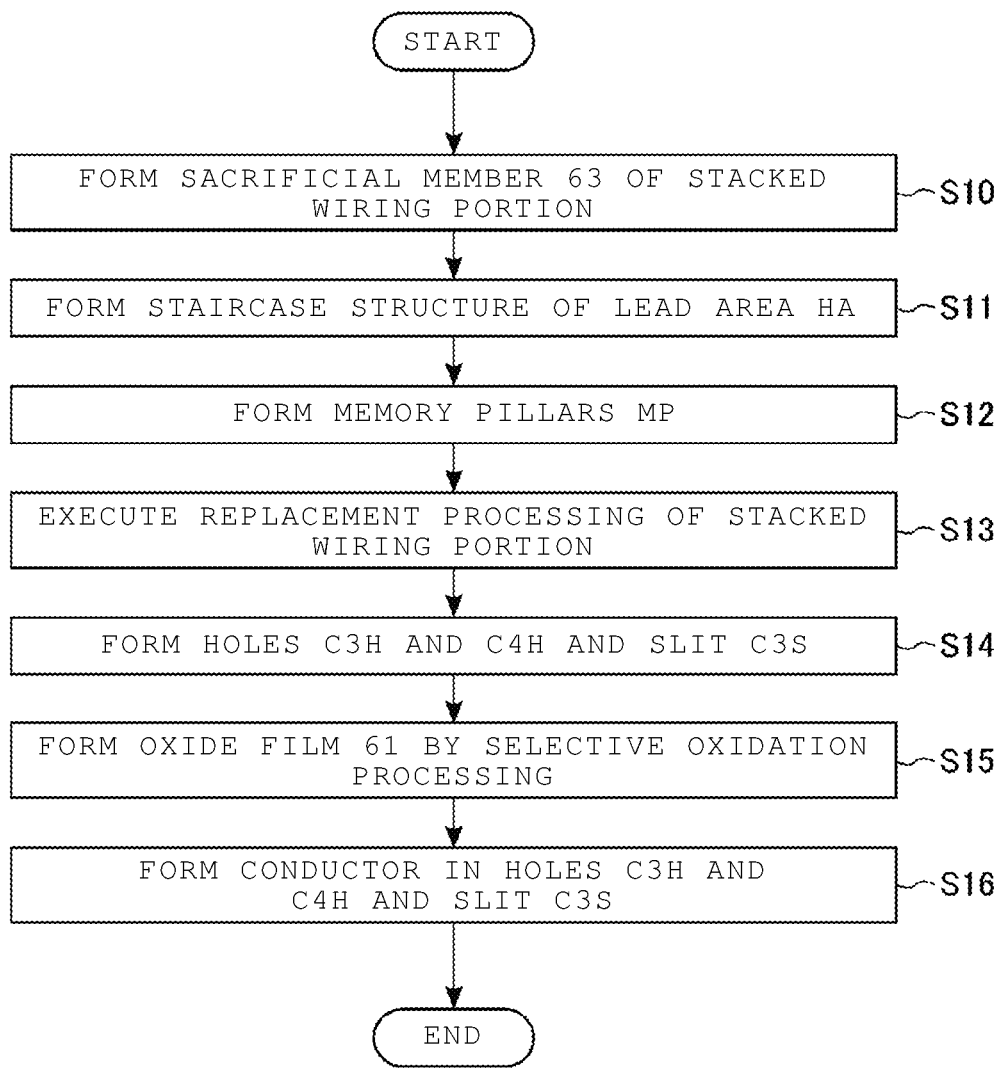
FIG. 12 is a flowchart illustrating an example of a method for manufacturing the semiconductor storage device according to the embodiment.

Hereinafter, an example of a series of manufacturing processes from the formation of the stacked wiring to the formation of the contact C3W in the semiconductor storage device 1 according to the embodiment will be described with reference to FIG. 12. FIG. 12 is a flowchart illustrating an example of a manufacturing method of the semiconductor storage device 1 according to the embodiment. Each of FIGS. 13 to 16 is an example of a cross-sectional structure in the process of manufacturing the semiconductor storage device 1 according to the embodiment and illustrates an extracted part of each of the contact region C4T, the memory area MA, the lead area HA, the contact region C3T, the wall region WR, and the end region ER. Hereinafter, a portion corresponding to the stacked wiring such as the word line WL is referred to as a stacked wiring portion.

First, a structure below the memory cell array 10 (for example, the conductor layers 24, 25, 28, and 29 in the wiring layer D2) is formed. The conductor layer 30 is formed, and the insulator layer 60 is formed by etching the conductor layer 30. Next, the conductor layer 31 is formed, and the conductor layer 31 is etched. As a result, a structure in which the conductor layer 31 remains in the core region CR, the wall region WR, the kerf region KR, and the bridge portions BR1 and BR2 is formed. Then, the processes of steps S10 to S13 are executed in order.

Figure 13:
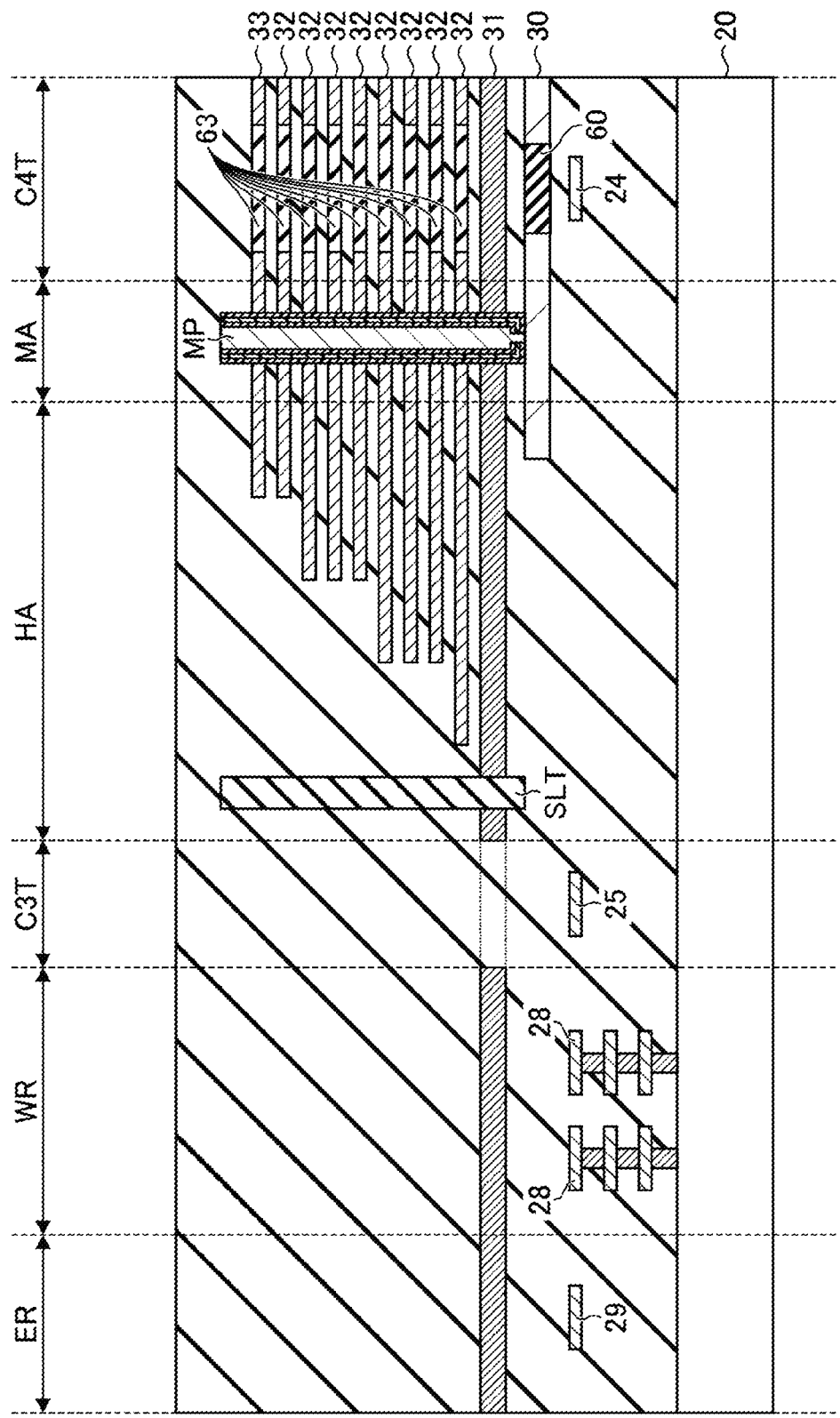
FIG. 13 illustrates a cross-sectional view of an example of a structure in a process of manufacturing a semiconductor storage device according to an embodiment.

The sacrificial member 63 is provided in the layer corresponding to the conductor layers 32 and 33 by the process of step S10. By the process in step S11, a staircase structure of the lead area HA is formed. Then, a plurality of memory pillars MP penetrating the stacked wiring portion in the memory area MA are formed by the process of step S12. After that, the replacement processing of the stacked wiring portion is performed by using the slit SLT in the process of step S13, and the sacrificial member 63 provided in a part of the memory area MA, the lead area HA, and the contact region C4T is replaced with a conductor. However, at this time, the sacrificial member 63 at a location corresponding to the penetrating area PA in the contact region C4T still remains after the replacement processing. As a result, stacked wirings corresponding to the word lines WL and the like are formed as illustrated in FIG. 13.

Figure 14:
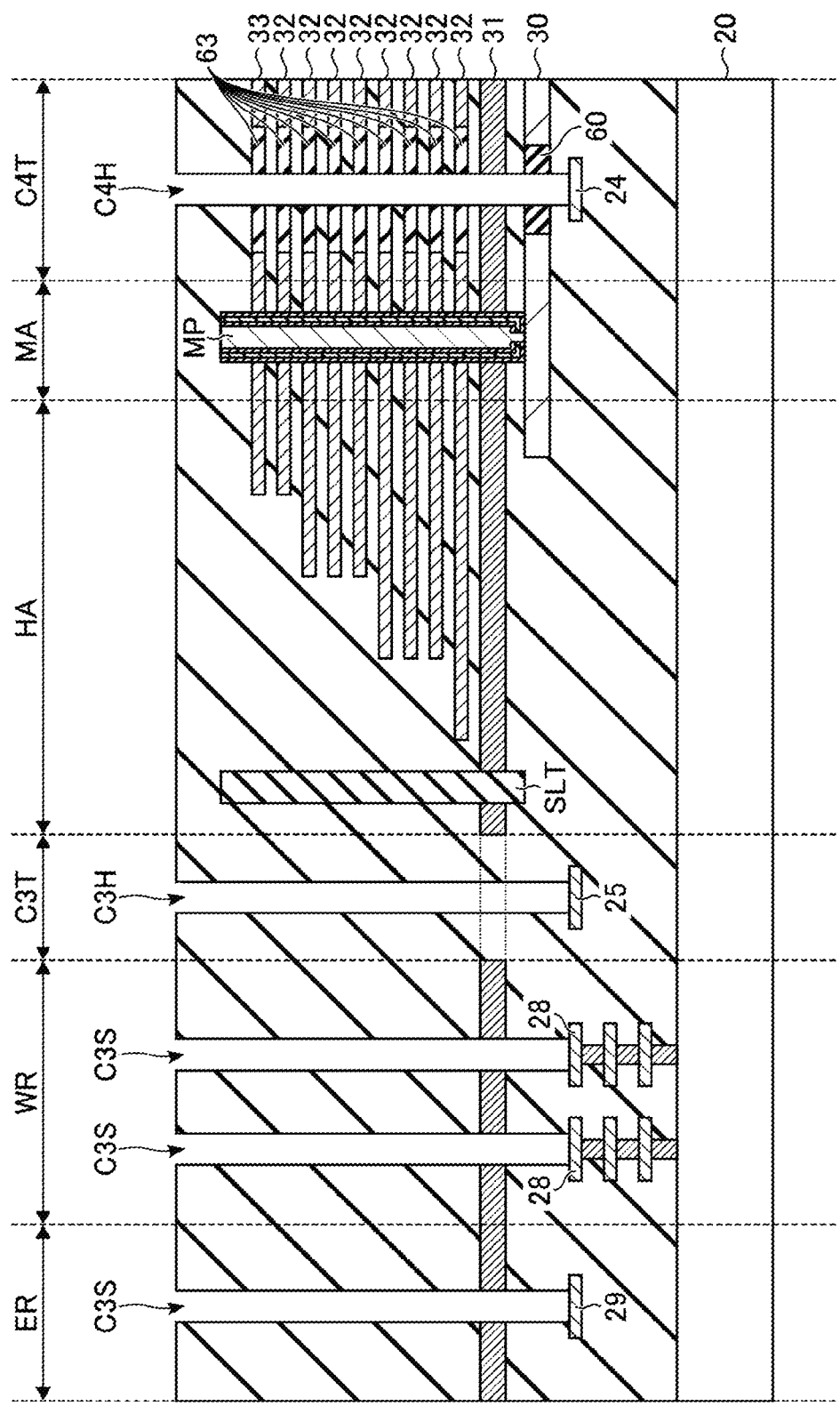
FIG. 14 illustrates a cross-sectional view of an example of a structure in the process of manufacturing the semiconductor storage device according to the embodiment.

Next, holes C3H and C4H and a slit C3S are formed by the process of step S14 as illustrated in FIG. 14. Specifically, the hole C3H is formed so that the surface of the conductor layer 25 is exposed in the contact region C3T. The hole C4H is formed in the contact region C4T so as to penetrate the sacrifice member 63, the conductor layer 31, and the insulator layer 60 and expose the surface of the conductor layer 24. The slit C3S is formed in each of the wall region WR and the end region ER. The slit C3S in the wall region WR is formed so that the surface of the conductor layer 28 is exposed, and the slit C3S in the end region ER is formed so that the surface of the conductor layer 29 is exposed. The shape of the hole C3H corresponds to the contact C3. The shape of the hole C4H corresponds to the contact C4. The shape of the slit C3S in the wall region WR corresponds to the contact C3W. The shape of the slit C3S in the end region ER corresponds to the contact C3L.

Figure 15:
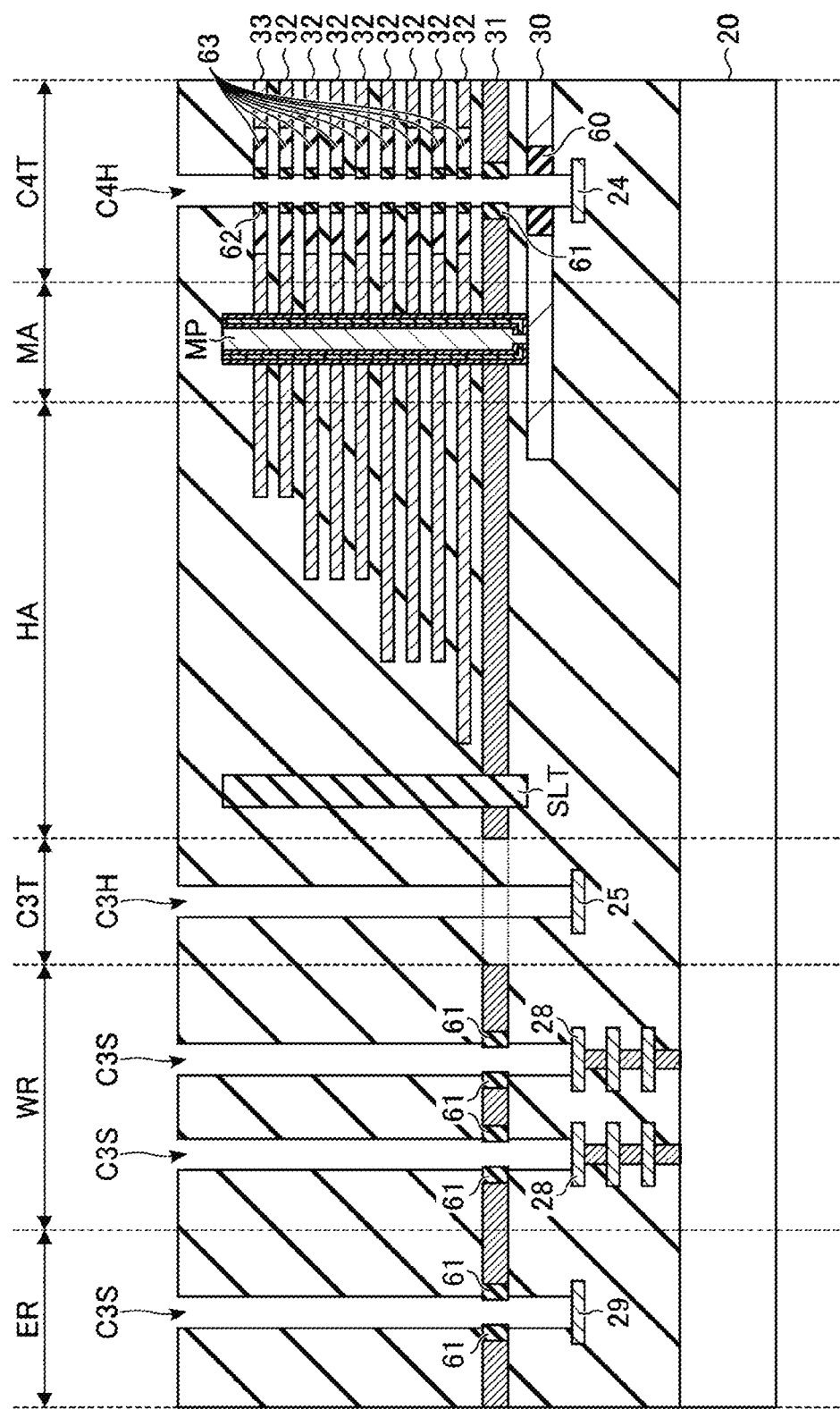
FIG. 15 illustrates a cross-sectional view of an example of a structure in the process of manufacturing the semiconductor storage device according to the embodiment.

Next, the oxide film 61 is formed by the process of step S15 as shown in FIG. 15. Specifically, selective oxidation processing is performed, and the conductor layer 31 and the sacrificial member 63 exposed in the hole C4H and the slit C3S are oxidized. Since polysilicon doped with phosphorus is used as the conductor layer 31, for example, the conductor layer 31 can be oxidized in a short time. As the sacrificial member 63, for example, silicon nitride is used, and therefore the oxidation rate of the sacrificial member 63 can be slower than that of the conductor layer 31. Therefore, the thickness of the oxide film 61 formed by the oxidized part of the conductor layer 31 is thicker than the oxide film 62 formed by the oxidized part of the sacrificial member 63. In the selective oxidation processing, the conductor layer 31 and the sacrificial member 63 are both partially expanded in volume due to the formation of the oxide, and therefore the diameter of the hole or the width of the slit becomes narrower at those locations.

Figure 16:
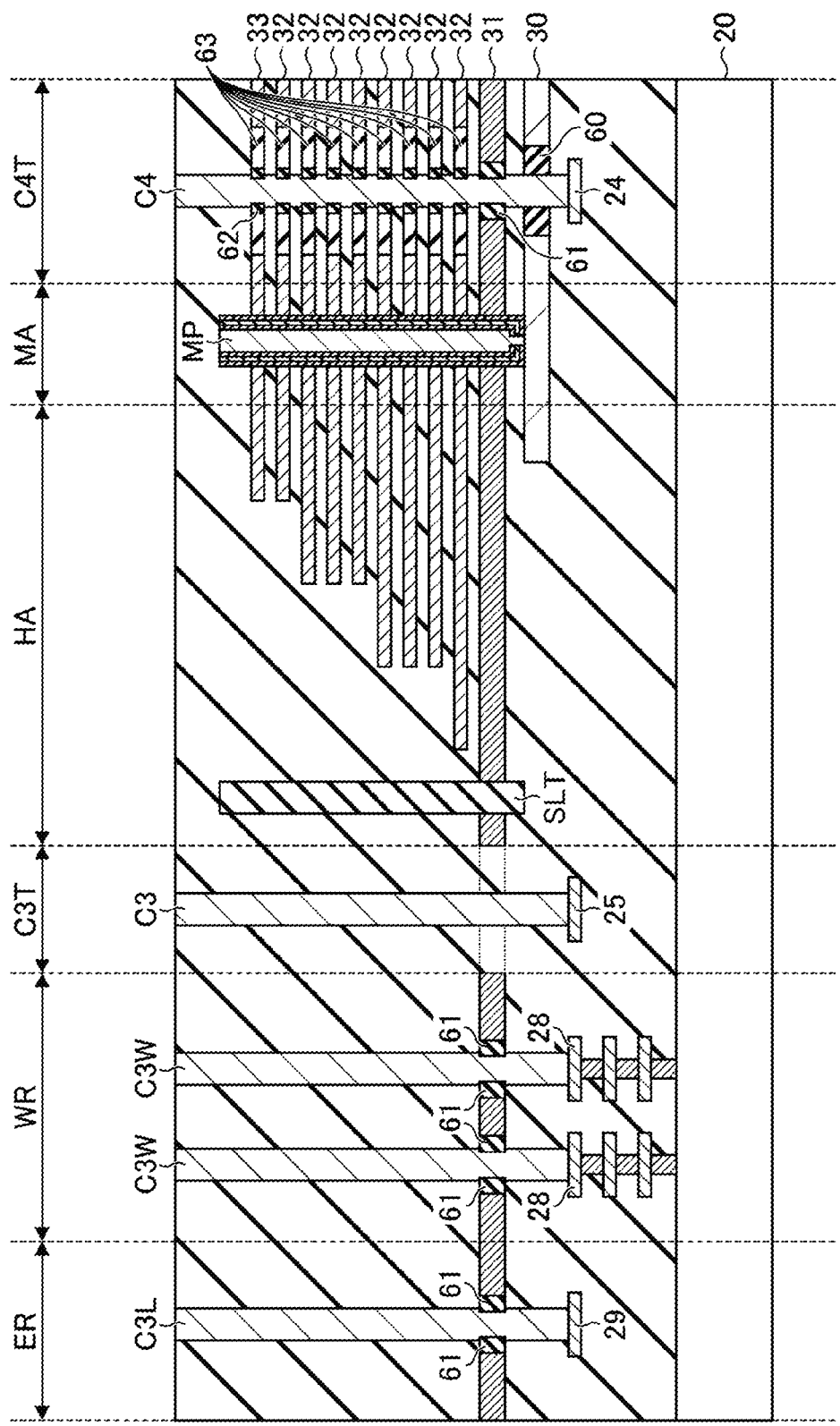
FIG. 16 illustrates a cross-sectional view of an example of a structure in the process of manufacturing the semiconductor storage device according to the embodiment.

Next, a conductor is formed in each of the holes C3H and C4H and the slit C3S by the process of step S16 as illustrated in FIG. 16. That is, the contact C3 is formed in the hole C3H, the contact C4 is formed in the hole C4H, the contact C3W is formed in the slit C3S in the wall region WR, and the contact C3L is formed in the slit C3S in the end region ER.

By the manufacturing process of the semiconductor storage device 1 according to the first embodiment described above, a structure in which the contact C3W and the conductor layer 31 are insulated by the oxide film 61 is formed. The manufacturing process described above is merely an example, and other processing may be inserted between the manufacturing processes, or the order of the manufacturing processes may be changed within a range in which no problem occurs.

[1-3] Effects of Embodiment

According to the semiconductor storage device 1 according to the embodiment described above, chip area can be reduced. Hereinafter, effects of the semiconductor storage device 1 according to the embodiment will be described.

In the manufacturing process of a semiconductor storage device in which memory cells are stacked in three dimensions, for example, a memory hole is formed in a stacked body in which sacrificial members and insulating members are alternately stacked, and a semiconductor member or the like corresponding to a memory cell or the like is formed in the memory hole. In the etching process for forming this memory hole, as the etching progresses, positive charges may be accumulated at the bottom of the memory hole, and a conductor (for example, a source line) that reaches the bottom of the memory hole may be positively charged. There is a risk of arcing between a positively charged conductor and a negatively charged wafer.

As a countermeasure, in the etching process in which the memory hole is formed, it is conceivable to provide a structure (e.g., stopper layer SP) in which the conductor layer 31 in the core region CR and the conductor layer 31 in the kerf region KR are electrically connected. With such a structure, positive charges accumulated at the bottom of the memory hole in the etching process for forming the memory hole can be discharged to the outer periphery of the wafer via the conductor layer 31. As a result, the positive charges accumulated at the bottom of the memory hole can be reduced, and therefore the arcing is less likely to occur.

Finally, since it is necessary to electrically divide the kerf region KR and the core region CA, the conductor layer 31 is divided by, for example, a step of forming the crack stopper CS. Specifically, the conductor layer 31 is divided by the slit C3S for forming the contacts C3W and C3L, and the current path between the kerf region KR and the core region CR of the conductor layer 31 is blocked. As a result, the conductor layer 31 used as the select gate line SGS is electrically insulated from the conductor layer 31 provided in the other region and may be used for control.

Figure 17:
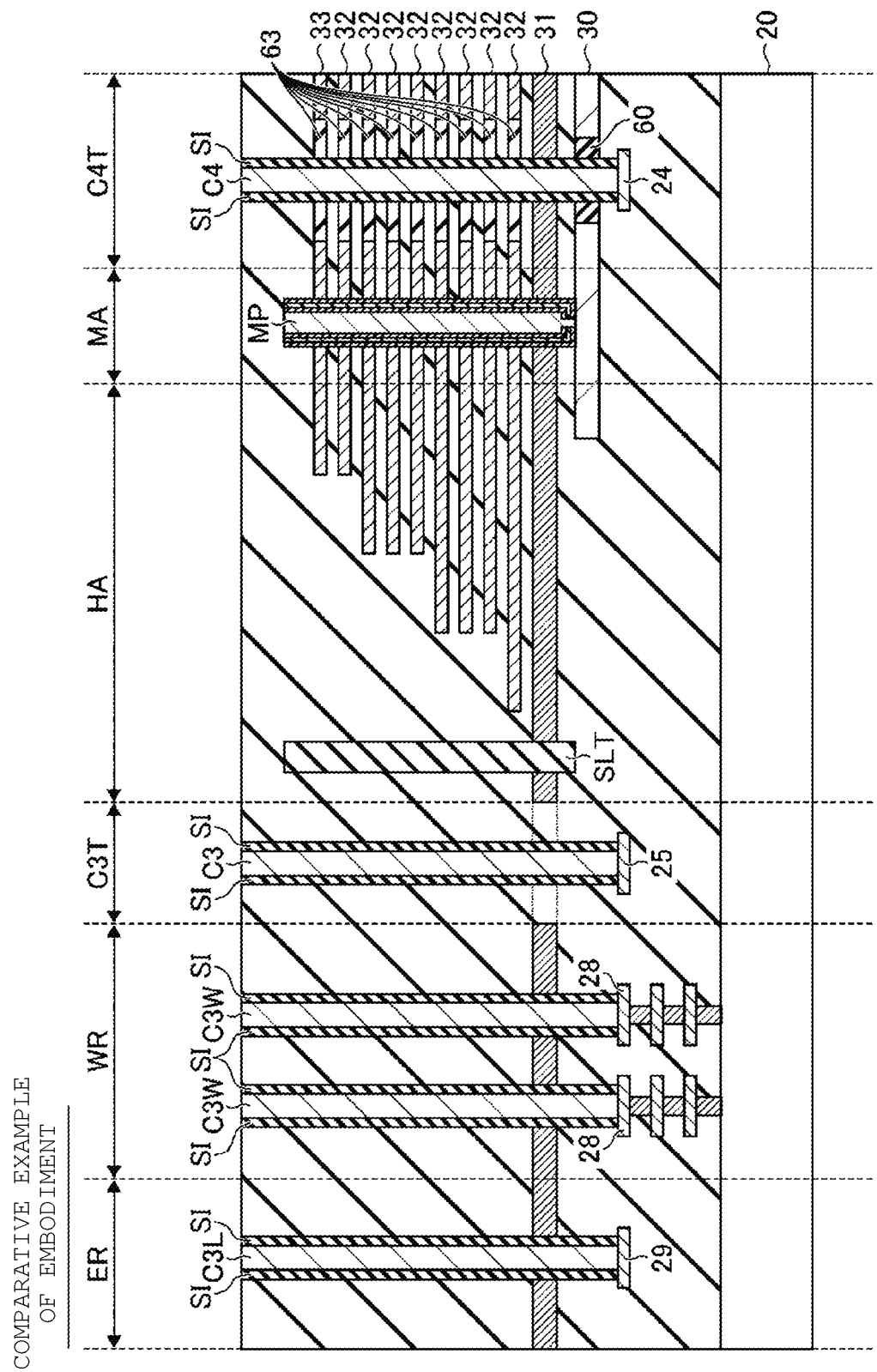
FIG. 17 illustrates a cross-sectional view of an example of a semiconductor storage device according to a comparative example.

An example of a method for insulating between the kerf region KR and the core region CR of the conductor layer 31 will be described with reference to FIG. 17. FIG. 17 illustrates a cross-sectional structure of the semiconductor storage device 1 according to a comparative example of the embodiment and illustrates a region similar to FIG. 16 in the embodiment. As illustrated in FIG. 17, in the semiconductor storage device 1 according to the comparative example, the contacts C3W, C3L, and C4 and the conductor layer 31 are insulated by a spacer insulating film SI. The spacer insulating film SI is provided on the side surfaces of the holes C3H and C4H and the slit C3S.

However, in a case where the spacer insulating film SI is used, when forming the contacts C3W, C3L, C3, and C4, it is necessary to remove the holes C3H and C4H and a part of the spacer insulating film SI provided at the bottom of the slit C3S. Such a process is one of the causes of contact failure. Since the spacer insulating film SI is formed, it is necessary to increase the diameters of the holes C3H and C4H and the width of the slit C3S.

In contrast, the semiconductor storage device 1 according to the embodiment has a structure in which the oxide film 61 is provided instead of the spacer insulating film SI. Specifically, in the method for manufacturing the semiconductor storage device 1 according to the embodiment, the selective oxidation process is performed after the holes C3H and C4H and the slit C3S are formed. As a result, the holes C3H and C4H and a part of the conductor layer 31 exposed in the slit C3S are oxidized, and the oxide film 61 is formed.

The oxide film 61 can insulate each of the contacts C3, C4, C3W, and C3L and the conductor layer 31 similarly to the spacer insulating film SI. When polysilicon doped with phosphorus is used for the conductor layer 31, the oxidation rate of the conductor layer 31 is faster than the oxidation rate of non-doped polysilicon. For this reason, the selective oxidation process can be performed at a low temperature and in a short time.

As described above, the semiconductor storage device according to the embodiment can insulate between the contacts C3W and C3L and the conductor layer 31 without providing the spacer insulating film SI. Thereby, in the semiconductor storage device 1 according to the embodiment, the diameter or width of each of the contacts C3, C4, C3W, and C3L can be reduced, and the chip area of the semiconductor storage device 1 can be reduced. Since the oxide film 61 is formed by thermal oxidation to improve the film quality, the breakdown voltage of the semiconductor storage device 1 can be improved.

[2] Other Modification Examples

The semiconductor storage device of the embodiment includes a substrate, a first conductor layer, a plurality of second conductor layers, a pillar, a first contact, and an oxide film. The substrate <for example, symbol 20 in FIG. 16> includes a core region <for example, symbol CR in FIG. 4> and a first region <for example, symbol CR in FIG. 4> provided to be separated from the core region and surround the outer periphery of the core region, and a second region <for example, symbol BR in FIG. 4> connecting between the core region and the first region. The first conductor layer is provided on a first layer above the substrate in the core region, the first region, and the second region. A plurality of second conductor layers <for example, symbol 32 in FIG. 18> are provided above the first conductor layer in the core region and separated from each other in a first direction. The pillar <for example, symbol MP in FIG. 18> penetrates the first conductor layer and the plurality of second conductor layers, and the intersection with the second conductor layer functions as a memory cell transistor. A first contact <for example, symbol C3W in FIG. 18> divides the first conductor layer in the first region. An oxide film <for example, symbol 61 in FIG. 18> is provided between the first contact and the first conductor layer in the first layer, insulates the first contact and the first conductor layer, and contains an impurity. Thereby, the chip area of the semiconductor storage device 1 can be reduced.

Figure 18:
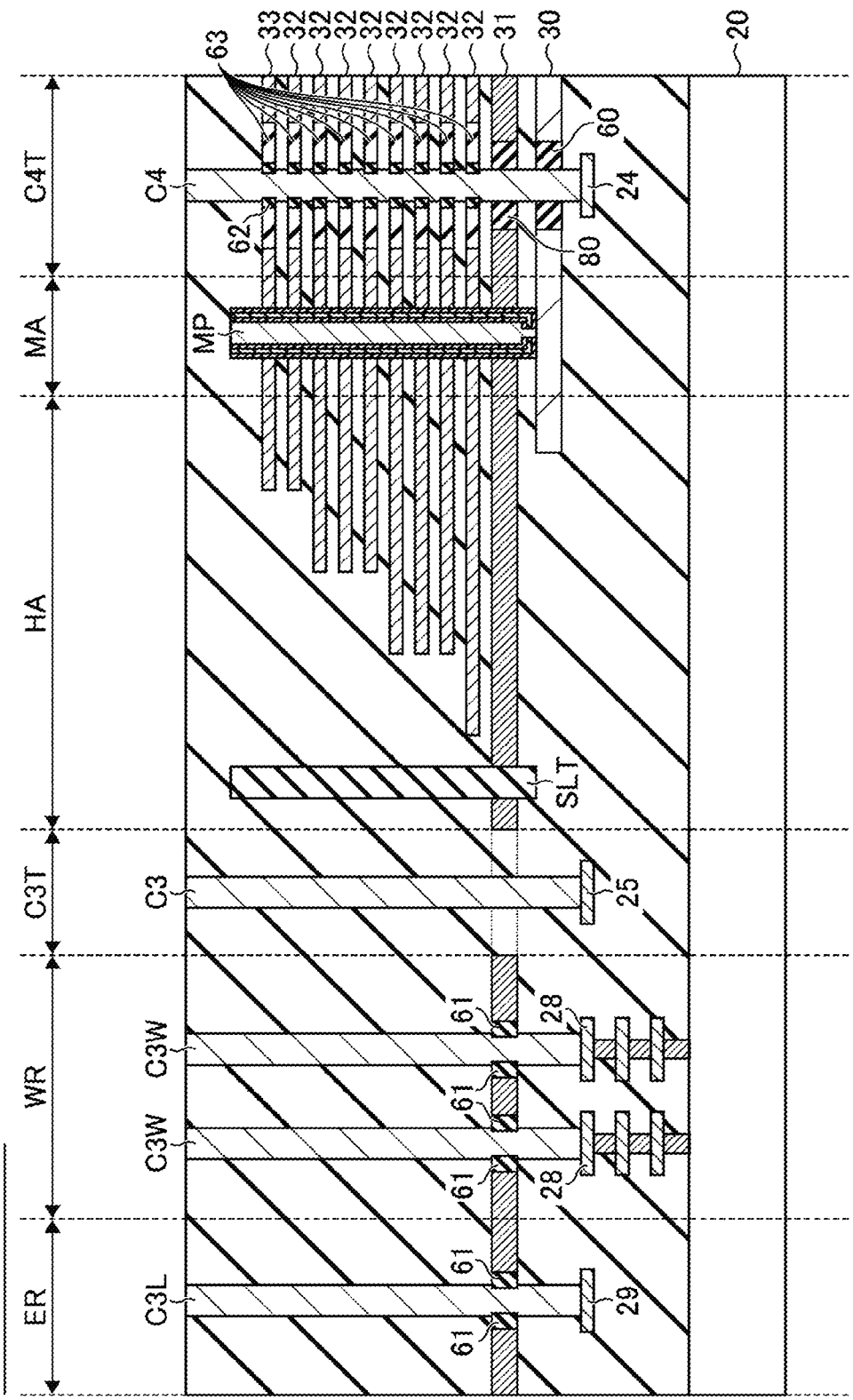
FIG. 18 illustrates a cross-sectional view of an example of a semiconductor storage device according to a modification example of an embodiment.

In the embodiment, the case where the oxide film 61 is provided between the contact C4 and the conductor layer 31 is illustrated, while other insulators may be used for insulation between the contact C4 and the conductor layer 31. FIG. 18 illustrates an example of a cross-sectional structure of the semiconductor storage device 1 according to the modification example of the embodiment. As illustrated in FIG. 18, a portion of the conductor layer 31 corresponding to the penetrating area PA may be removed by processing after the formation of the conductor layer 31, and the insulator layer 80 may be provided in the region. Even in such a case, since the contact C4 and the conductor layer 31 are insulated by the insulator layer 80, the contact C4 may be used as in the embodiment.

In the above embodiment, the case where the semiconductor layer 40 in the memory pillar MP is electrically connected to the conductor layer 30 (source line SL) via the bottom surface of the memory pillar MP is illustrated, but the present disclosure is not limited thereto. For example, in the semiconductor storage device 1, the semiconductor layer 40 in the memory pillar MP and the source line SL may be connected via the side surface of the memory pillar MP. The memory pillar MP may have a structure in which a plurality of pillars are connected in the Z direction or may have a structure in which a pillar corresponding to the select gate line SGD and a pillar corresponding to the word line WL are connected.

In the above, the case where the memory pillar MP and the conductor layer 34 are connected via one contact CV is illustrated, but the present disclosure is not limited thereto. As a contact CV, two or more contacts connected in the Z direction may be used. When a plurality of contacts are connected in the Z direction, different conductor layers may be inserted between adjacent contacts. The same applies to the other contacts.

In the example embodiment, the number of conductor layers 32 is set based on the intended number of word lines WL. A plurality of conductor layers 31 provided in a plurality of layers may be assigned to the select gate line SGS. When the select gate line SGS is provided in a plurality of layers, a conductor different from the conductor layer 31 may be used. A plurality of conductor layers 33 provided in a plurality of layers may be assigned to the select gate line SGD.

In some embodiments, the memory cell array 10 may include one or more dummy word lines between the word line WL0 and the select gate line SGS and between the word line WL7 and the select gate line SGD. If a dummy word line is provided, dummy transistors can likewise be provided between the memory cell transistor MT0 and the select transistor ST2 and between the memory cell transistor MT7 and the select transistor ST1, corresponding to the number of dummy word lines. A dummy transistor is a transistor that has substantially the same structure as the memory cell transistor MT but is not used for data storage. Similarly, when two or more memory pillars MP are connected to each other in the Z direction, the memory cell transistor(s) MT near the connecting portions of the pillars may be used as a dummy transistor.

In the drawings used for description in the embodiment, the case in which the outer diameter of the memory pillar MP does not change according to the layer position is illustrated, but the present disclosure is not limited thereto. For example, the memory pillar MP may have a taper shape, a reverse taper shape, or a shape in which the intermediate portion is enlarged relative to the end portions. Similarly, the slits SLT and SLTa may have a taper shape, a reverse taper shape, or a shape in which the intermediate portion is enlarged relative to the end portions.

In this specification, "rectangular ring shape" refers to any ring shape having a portion that extends at least in a direction in which target components intersect each other. The "rectangular ring shape" may have a corner portion (or portions) formed obliquely or may have a portion whose side is not formed in a straight line. In this specification, a "ring shape" is not limited to a circular shape and includes a rectangular ring shape.

In this specification, "outer diameter" indicates the diameter of a component in a cross section parallel to the surface of the semiconductor substrate. "Outer diameter" indicates, for example, the diameter of the outermost member among the members in the hole used for forming a component. "Diameter" indicates an inner diameter of a hole or the like in a cross section parallel to the surface of the semiconductor substrate. "Width" indicates, for example, the width of a component in the X direction or the Y direction.

In this specification, "connection" indicates that components are electrically connected and does not exclude, for example, that another component being interposed therebetween. "Electrically connected" may include an insulator between connected components as long as the connected components may operate in the same manner as those that are directly electrically connected. "Columnar shape" indicates a structure provided in a hole formed in the manufacturing process of the semiconductor storage device 1 or the like.

While certain embodiments have been described, these embodiments have been presented by way of example only, and are not intended to limit the scope of the inventions. These novel embodiments may be implemented in various other forms, and various omissions, replacements, and changes may be made without departing from the spirit of the present disclosure. These embodiments and modification examples thereof fall within the scope and gist of the present disclosure, the claims and the equivalent scope thereof.

What is claimed is:

1. A semiconductor storage device, comprising:
   a substrate;
   a first conductor layer above the substrate in a core region;
   a second conductor layer above the first conductor layer in the core region, a first region surrounding the core region, and a second region connecting the core region to the first region;
   a plurality of third conductor layers on the second conductor layer in the core region, the third conductor layers being spaced from each other in a first direction crossing the substrate;
   a plurality of memory pillars extending through the plurality of third conductor layers and being in contact with the first conductor layer in the core region; and
   a first contact provided in the first region and extending in the first direction, the first contact surrounding the plurality of third conductor layers in the core region in a cross-section along a surface of the substrate and separating a part of the second conductor layer in the first region into a first portion that is surrounded by the first contact and a second portion that surrounds the first contact, wherein
   the first portion is in contact with the first contact via a first oxidized portion,
   the second portion is in contact with the first contact via a second oxidized portion,
   the first oxidized portion contains a first impurity, and
   the second oxidized portion contains a second impurity.

2. The semiconductor storage device according to claim 1, wherein
   the first oxidized portion electrically isolates the first portion from the first contact, and
   the second oxidized portion electrically isolates the second portion from the first contact.

3. The semiconductor storage device according to claim 1, wherein
   the first impurity is at least one of phosphorus, arsenic, and boron, and
   the second impurity is at least one of phosphorus, arsenic, and boron.

4. The semiconductor storage device according to claim 1, wherein
   the first oxidized portion extends into the first contact, and
   the second oxidized portion extends into the first contact.

5. The semiconductor storage device according to claim 1, wherein the second conductor layer in the core region is a select gate line.

6. The semiconductor storage device according to claim 1, further comprising:

a second contact provided in the first region and extending in the first direction, wherein
the second contact is electrically isolated from the second conductor layer.

7. The semiconductor storage device according to claim 6, wherein an upper surface of the first contact is flush with an upper surface of the second contact.

8. The semiconductor storage device according to claim 6, wherein the second conductor layer in the first region is in contact with the second contact via a third oxidized portion.

9. The semiconductor storage device according to claim 1, wherein the first contact has a rectangular ring shape in a cross-section along the surface of the substrate.

10. The semiconductor storage device according to claim 1, wherein
the second conductor layer is also in a third region surrounding the first region and a fourth region connecting the first region to the third region.

11. The semiconductor storage device according to claim 10, wherein
the first conductor layer in the first region has a rectangular ring shape in a cross-section along the surface of the substrate, and
the first conductor layer in the third region has a rectangular ring shape in a cross-section along the surface of the substrate.

12. A method for manufacturing a semiconductor storage device, the method comprising:
forming a first conductor layer above a core region, a first region, and a second region of a substrate, the first region surrounding the core region, and the second region connecting the core region and the first region;
forming a plurality of sacrificial layers separated from each other in a thickness direction of the substrate above the core region of the substrate and above the first conductor layer;
forming a plurality of pillars extending through the first conductor layer above the core region and the plurality of sacrificial layers;
removing a part of each of the plurality of sacrificial layers and forming a second conductor layer in a space from which the part of each of the plurality of sacrificial layers is removed;
forming a slit that divides a part of the first conductor layer above the first region into a first portion surrounded by the slit and a second portion surrounding the slit;
selectively oxidizing a first side surface of the first portion that is exposed in the slit and a second surface of the second portion that is exposed in the slit; and
after the selective oxidizing, forming a first contact in the slit.

13. The method according to claim 12, wherein
the first side surface of the first portion that has been oxidized electrically isolates the first portion of the first conductor layer from the first contact, and
the second side surface of the second portion that has been oxidized electrically isolates the second portion of the first conductor layer from the first contact.

14. The method according to claim 13, wherein
the first side surface of the first portion that has been oxidized contains a first impurity, and
the second side surface of the second portion that has been oxidized contains a second impurity.

15. The method according to claim 14, wherein
the first impurity is at least one of phosphorus, arsenic, and boron, and
the second impurity is at least one of phosphorous, arsenic, and boron.

16. A semiconductor storage device, comprising:
a substrate;
a first conductor layer above the substrate in a core region;
a second conductor layer above the first conductor layer in the core region, a first region surrounding the core region, and a second region connecting the core region to the first region;
a plurality of third conductor layers on the second conductor layer in the core region, the third conductor layers being spaced from each other in a first direction crossing the substrate;
a plurality of memory pillars extending through the plurality of third conductor layers and being in contact with the first conductor layer in the core region; and
a first contact provided in the first region and extending in the first direction, the first contact surrounding the plurality of third conductor layers in the core region in a cross-section along a surface of the substrate and separating a part of the second conductor layer in the first region into a first portion that is surrounded by the first contact and a second portion that surrounds the first contact, wherein
the first portion is in contact with the first contact via a first oxidized portion,
the second portion is in contact with the first contact via a second oxidized portion,
the first oxidized portion extends into the first contact, and
the second oxidized portion extends into the first contact.

17. The semiconductor storage device according to claim 16, wherein
the first oxidized portion electrically isolates the first portion from the first contact, and the second oxidized portion electrically isolates the second portion from the first contact.

18. The semiconductor storage device according to claim 16, wherein the second conductor layer in the core region is a select gate line.

19. The semiconductor storage device according to claim 16, further comprising: a second contact provided in the first region and extending in the first direction, wherein the second contact is electrically isolated from the second conductor layer.

20. The semiconductor storage device according to claim 19, wherein an upper surface of the first contact is flush with an upper surface of the second contact.

* * * * *